(12) United States Patent
Shoki et al.

(10) Patent No.: US 10,347,485 B2
(45) Date of Patent: Jul. 9, 2019

(54) REFLECTIVE MASK BLANK, METHOD FOR MANUFACTURING SAME, REFLECTIVE MASK, METHOD FOR MANUFACTURING SAME, AND METHOD FOR MANUFACTURING SEMICONDUCTOR DEVICE

(71) Applicant: HOYA CORPORATION, Tokyo (JP)

(72) Inventors: Tsutomu Shoki, Tokyo (JP); Tatsuo Asakawa, Tokyo (JP); Hirofumi Kozakai, Tokyo (JP)

(73) Assignee: HOYA CORPORATION, Shinjuku-ku, Tokyo (JP)

( * ) Notice: Subject to any disclaimer, the term of this patent is extended or adjusted under 35 U.S.C. 154(b) by 96 days.

(21) Appl. No.: 15/508,544

(22) PCT Filed: Sep. 14, 2015

(86) PCT No.: PCT/JP2015/075970
§ 371 (c)(1),
(2) Date: Mar. 3, 2017

(87) PCT Pub. No.: WO2016/043147
PCT Pub. Date: Mar. 24, 2016

(65) Prior Publication Data
US 2017/0263444 A1 Sep. 14, 2017

(30) Foreign Application Priority Data
Sep. 17, 2014 (JP) .................................. 2014-188680
Dec. 26, 2014 (JP) .................................. 2014-265214

(51) Int. Cl.
| | | |
|---|---|---|
| G03F 1/24 | (2012.01) | |
| G03F 1/48 | (2012.01) | |
| G03F 1/54 | (2012.01) | |
| G03F 1/76 | (2012.01) | |
| G03F 1/80 | (2012.01) | |
| G03F 1/86 | (2012.01) | |
| G03F 7/20 | (2006.01) | |
| C23C 14/18 | (2006.01) | |
| C23C 14/34 | (2006.01) | |
| C23C 14/46 | (2006.01) | |
| C23C 14/58 | (2006.01) | |
| H01L 21/027 | (2006.01) | |
| C23C 14/00 | (2006.01) | |
| C23C 14/06 | (2006.01) | |
| C23C 14/35 | (2006.01) | |

(52) U.S. Cl.
CPC .......... *H01L 21/0274* (2013.01); *C23C 14/18* (2013.01); *C23C 14/185* (2013.01); *C23C 14/34* (2013.01); *C23C 14/46* (2013.01); *C23C 14/5806* (2013.01); *G03F 1/24* (2013.01); *G03F 1/48* (2013.01); *G03F 1/54* (2013.01); *G03F 1/76* (2013.01); *G03F 1/80* (2013.01); *G03F 1/86* (2013.01); *G03F 7/2002* (2013.01)

(58) Field of Classification Search
CPC ..... G03F 1/24; G03F 1/48; G03F 1/54; G03F 1/76; G03F 1/80; G03F 1/86; G03F 7/2002
USPC .......................................................... 430/5
See application file for complete search history.

(56) References Cited

U.S. PATENT DOCUMENTS

| | | |
|---|---|---|
| 6,984,475 B1 | 1/2006 | Levinson et al. |
| 2003/0194615 A1 | 10/2003 | Krauth |
| 2004/0151988 A1 | 8/2004 | Silverman |
| 2004/0175633 A1 | 9/2004 | Shoki et al. |
| 2005/0238963 A1 | 10/2005 | Ishibashi et al. |
| 2007/0077499 A1 | 4/2007 | Ikuta et al. |
| 2008/0193862 A1 | 8/2008 | Ishibashi et al. |
| 2009/0220869 A1 | 9/2009 | Takai |
| 2009/0231707 A1 | 9/2009 | Ehm et al. |
| 2011/0059391 A1 | 3/2011 | Shoki |
| 2012/0145534 A1 | 6/2012 | Kageyama |
| 2013/0323630 A1 | 12/2013 | Maeshige et al. |
| 2014/0011123 A1 | 1/2014 | Okamura et al. |

FOREIGN PATENT DOCUMENTS

| | | |
|---|---|---|
| JP | 05113656 A | 5/1993 |
| JP | 08-293450 A | 11/1996 |

(Continued)

OTHER PUBLICATIONS

International Search Report of PCT/JP2015/075970 dated Nov. 24, 2015.

(Continued)

*Primary Examiner* — Christopher G Young
(74) *Attorney, Agent, or Firm* — Sughrue Mion, PLLC

(57) ABSTRACT

The present invention aims to provide a reflective mask blank and a reflective mask which have a highly smooth multilayer reflective film as well as a low number of defects, and methods of manufacturing the same, and aims to prevent charge-up during a mask defect inspection using electron beams.

The present invention provides a reflective mask blank for EUV lithography in which a conductive underlying film, a multilayer reflective film that reflects exposure light, and an absorber film that absorbs exposure light are layered on a substrate, wherein the conductive underlying film is a single-layer film made of a tantalum-based material or a ruthenium-based material with a film thickness of greater than or equal to 1 nm and less than or equal to 10 nm that is formed adjacent to the multilayer reflective film, or the conductive underlying film is a multilayer film including a layer of a tantalum-based material with a film thickness of greater than or equal to 1 nm and less than or equal to 10 nm that is formed adjacent to the multilayer reflective film and a layer of a conductive material that is formed between the layer of the tantalum-based material and the substrate. The present invention also provides a reflective mask manufactured using the reflective mask blank. Furthermore, a semiconductor device is manufactured using the reflective mask.

34 Claims, 4 Drawing Sheets

(56) References Cited

FOREIGN PATENT DOCUMENTS

| | | |
|---|---|---|
| JP | 2004-039884 A | 2/2004 |
| JP | 2004-289110 A | 10/2004 |
| JP | 2005-268750 A | 9/2005 |
| JP | 2009-510711 A | 3/2009 |
| JP | 2009-212220 A | 9/2009 |
| JP | 2010-503980 A | 2/2010 |
| JP | 2010-080659 A | 4/2010 |
| JP | 2011-192693 A | 9/2011 |
| JP | 2012-129520 A | 7/2012 |
| JP | 2012-204708 A | 10/2012 |
| JP | 2013-225662 A | 10/2013 |
| JP | 2014-056895 A | 3/2014 |
| JP | 2014-096484 A | 5/2014 |
| WO | 2009/136564 A1 | 11/2009 |
| WO | 2012/105698 A1 | 8/2012 |
| WO | 2012/121159 A1 | 9/2012 |

OTHER PUBLICATIONS

Communication draft dated May 16, 2018 from the Japanese Patent Office in counterpart Application No. 2014-188680.
Notice of Reasons for Refusal issued in corresponding Japanese Patent Application No. 2015-180419 dated Apr. 16, 2019.

[Fig. 1]
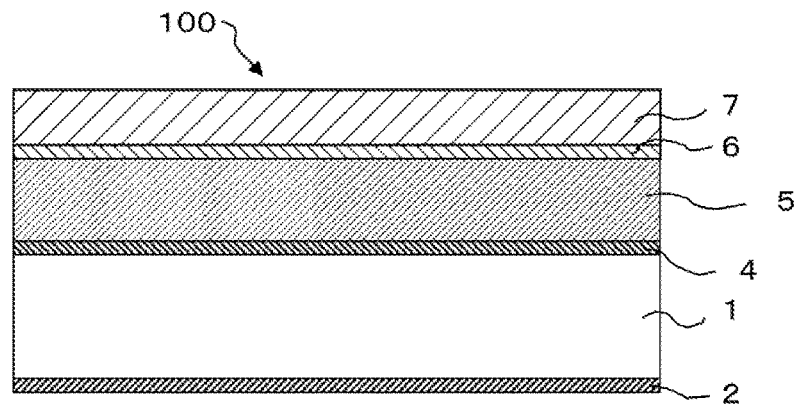
[Fig. 2]
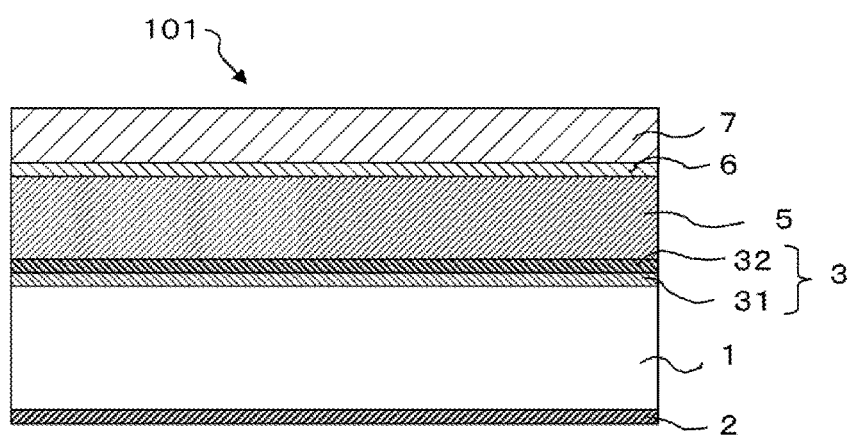
[Fig. 3]
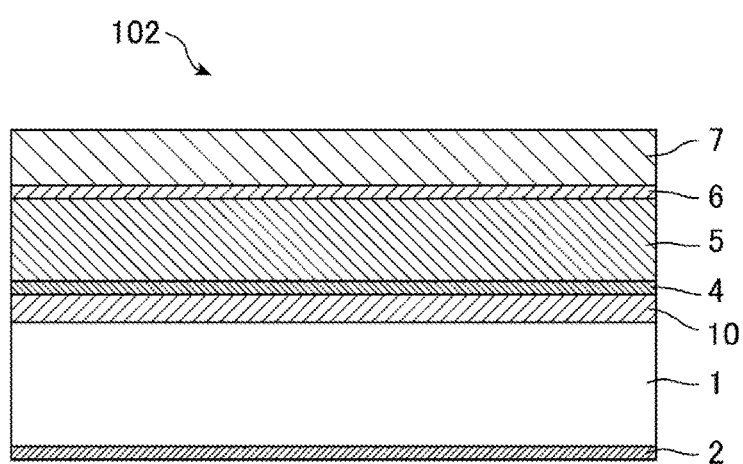

[Fig. 4]
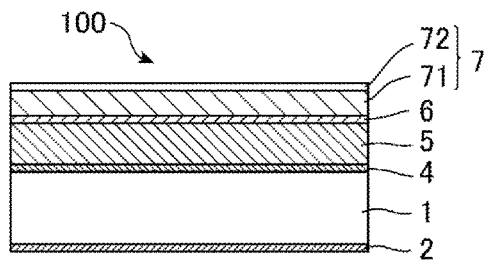
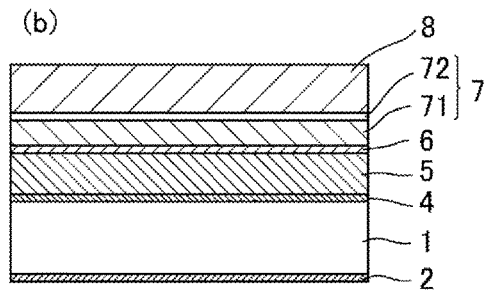
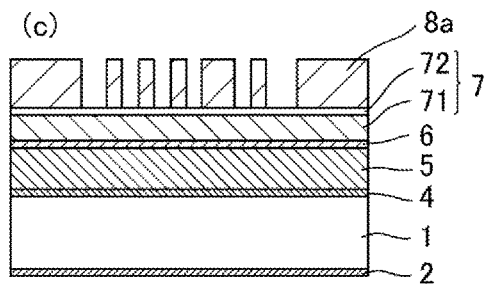
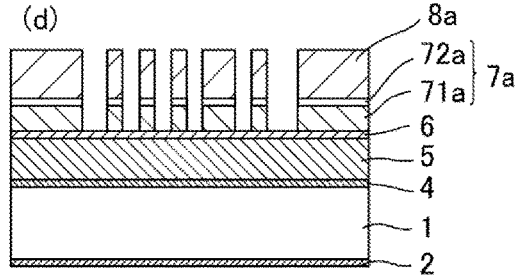
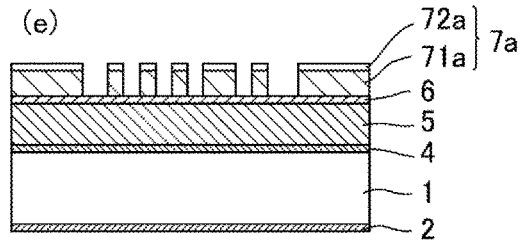
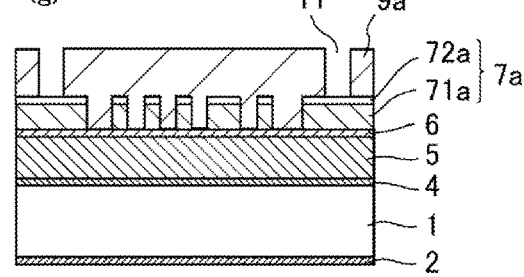
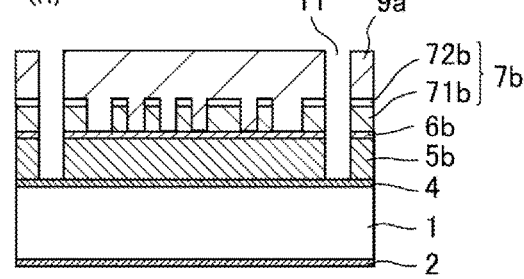
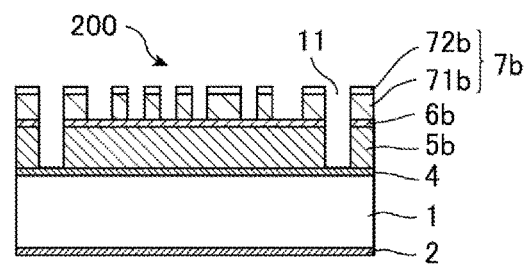

[Fig. 5]
(a)
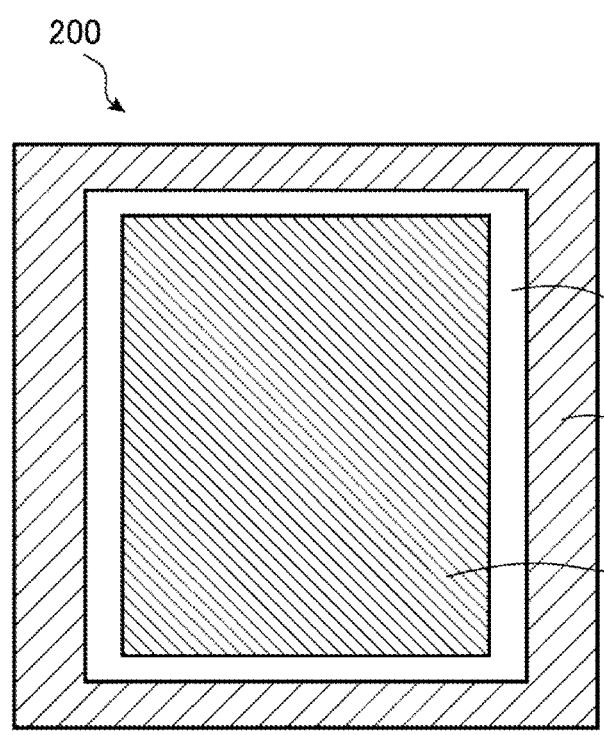
(b)
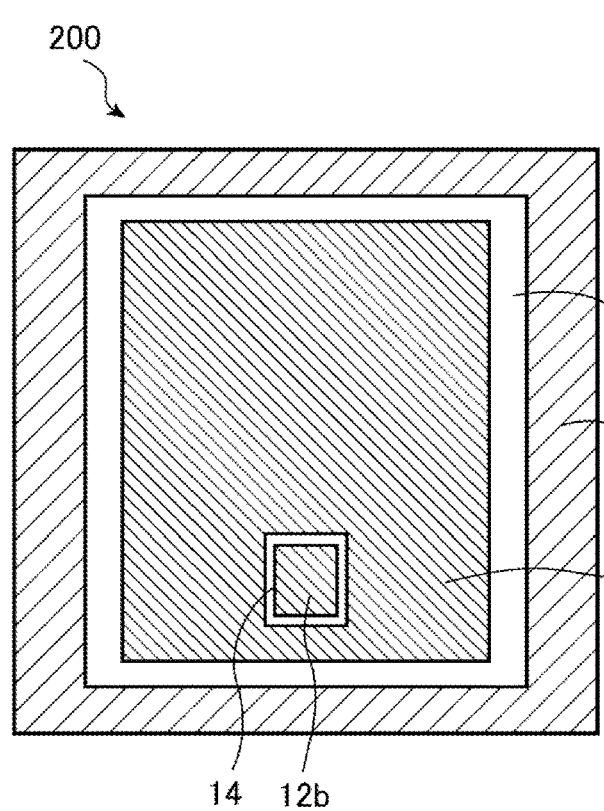

[Fig. 6]
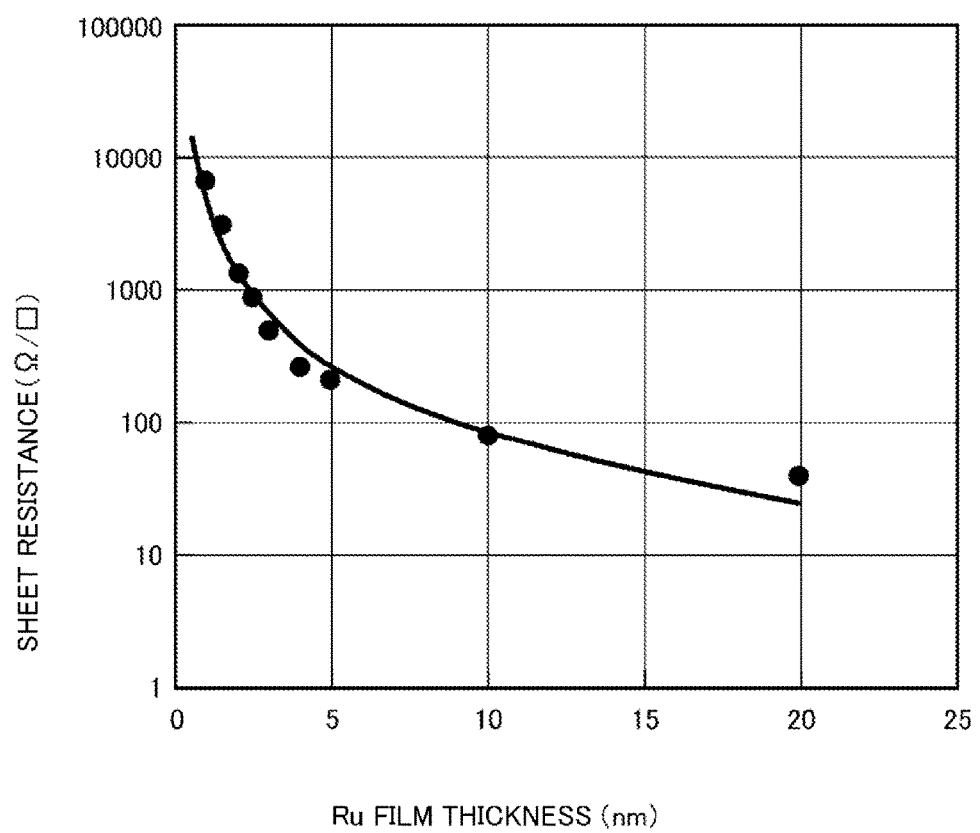

REFLECTIVE MASK BLANK, METHOD FOR MANUFACTURING SAME, REFLECTIVE MASK, METHOD FOR MANUFACTURING SAME, AND METHOD FOR MANUFACTURING SEMICONDUCTOR DEVICE

CROSS REFERENCE TO RELATED APPLICATIONS

This is a National Stage of International Application No. PCT/JP2015/075970 filed Sep. 14, 2015, claiming priority based on Japanese Patent Application No. 2014-188680 filed Sep. 17, 2014 and Japanese Patent Application No. 2014-265214 filed Dec. 26, 2014, the contents of all of which are incorporated herein by reference in their entirety.

TECHNICAL FIELD

The present invention relates to a reflective mask blank which is an original plate for manufacturing an exposure mask used to manufacture a semiconductor device or the like, to a method of manufacturing that reflective mask blank, to a reflective mask manufactured using the reflective mask blank, to a method of manufacturing that reflective mask, and to a method of manufacturing a semiconductor device.

BACKGROUND ART

The types of light sources used in exposure apparatus for manufacturing semiconductors include g-rays with a wavelength of 436 nm, i-rays with a wavelength of 365 nm, KrF lasers with a wavelength of 248 nm, and ArF lasers with the wavelength of 193 nm, for example. These technologies have evolved to use increasingly shorter wavelengths of light, and extreme ultraviolet (EUV) lithography, which uses extreme ultraviolet (EUV) light with wavelengths near 13.5 nm, has been developed to make it possible to transfer even smaller patterns. In EUV lithography, reflective masks are used instead of transmissive masks because there are few materials that are transparent to EUV light. The reflective masks have a basic structure in which a multilayer reflective film that reflects exposure light is formed on a substrate with low thermal expansion, and a desired transfer pattern is formed on top of a protective film which is for protecting the multilayer reflective film.

Transfer patterns typically take the form of phase shift films (half-tone phase shift type) that reflect a fixed amount of EUV light or the form of absorber films (binary type) that exhibit a relatively strong absorption of EUV light. However, even the absorber films (which absorb a large amount of EUV light and generate a relatively small reflected light) will reflect approximately 0.5% of the EUV light. Therefore, when EUV reflective masks are formed, regardless of whether the phase shift films or the absorber films are used, dedicated light-shielding bands must be formed in order to sufficiently reduce the effects of the reflection of exposure light that is generated adjacently. Here, the "light-shielding bands" refers to a light-shielding frame (region) that is formed so as to surround circuit pattern regions of the mask in order to prevent exposure light from leaking into regions adjacent to a block on a wafer to which a pattern is to be transferred (such as the circuit pattern regions where the pattern is to be transferred). If this light-shielding band does not make it possible to sufficiently reduce the amount of reflected light, the exposure light leaks into the adjacent regions. This can cause a decrease in the resolution of the patterns in the adjacent regions or a decrease in the precision of the transfer size, thereby resulting in a reason for a decrease in yield rate. When the light-shielding band is formed simply using the phase shift film or the absorber film in EUV reflective mask, there is a large amount of reflected light, and this can cause the problems described above. Therefore, a light-shielding band with sufficient light-shielding properties (sufficient reflection-reducing properties) must be used. One representative example of a light-shielding band for an EUV lithography reflective mask is an etched light-shielding band where a portion of a multilayer reflective film which is to be the light-shielding band is etched (hereinafter, simply referred to be as "multilayer reflective film-etched light-shielding band"). This configuration is more advantageous than a multilayer absorber film-type light-shielding band in which additional absorber films for the light-shielding band are layered onto the absorber film used for a transfer pattern in terms of forming transfer patterns with higher precision, reducing occurrence of defects, and preventing the shadowing effects exhibited by multilayer light-shielding band films.

Patent Documents 1 to 4 disclose technologies related to reflective masks for EUV lithography and mask blanks for manufacturing the reflective masks. Patent Document 1 also discloses a light-shielding band and the shadowing effect.

CITATION LIST

Patent Literature

Patent Document 1: Japanese Unexamined Patent Application Publication No. 2009-212220A
Patent Document 2: Japanese Unexamined Patent Application Publication No. 2010-080659A
Patent Document 3: Japanese Unexamined Patent Application Publication No. 2004-39884A
Patent Document 4: Japanese Unexamined Patent Application Publication No. 2005-268750A

SUMMARY OF INVENTION

Technical Problem

EUV lithography utilizes light with a wavelength of 13.5 nm (which is approximately ¹/₁₅ of the wavelength of light used in ArF lithography—more than an order of magnitude shorter) and therefore, EUV lithography makes it possible to achieve extremely high resolution. Accordingly, fatal defects in reflective masks for EUV lithography are extremely small in size. Defects in reflective masks for EUV lithography can be largely categorized into a pattern defect (hereinafter, referred to be as a "mask pattern defect") in absorber patterns or phase shift patterns, and a defect in multilayer reflective films. In order to reduce the mask pattern defect with an extremely small size, pattern defect inspections that utilize an electron beam (EB) with extremely high detection sensitivity toward hyperfine patterns (hereinafter, referred to be as a "mask pattern EB defect inspection") is required to be performed. Any charge-up that occurs during the EB mask pattern defect inspection can potentially decrease the detection sensitivity or cause misdetections, and therefore, it is extremely important to prevent the charge-up. However, in an EUV lithography reflective mask with a multilayer reflective film-etched light-shielding band-type, the absorber film and the multilayer reflective film, which are conductors, are divided by the light-shielding band, and this causes the circuit pattern formation portion to be electrically isolated. Accordingly, it becomes impossible to establish an electrical ground. As a result, the charge-up might occur by an electron beam during the mask pattern EB defect inspection.

Meanwhile, in order to reduce defects in the multilayer reflective film, the surface of the underlying film directly beneath the multilayer reflective film must be smoothed to an extremely high degree. The reason for this is because reflective masks for EUV lithography exhibit a problem known as phase defects that are not present in transmissive masks. Here, any small irregularities in the surface of the underlying film directly beneath the multilayer reflective film cause irregularities (warping) in the multilayer reflective film which is formed on top of the underlying film, thereby causing partial phase differences to occur. This results in local variation in the reflectance of EUV light and can potentially be a cause of fatal defects. Moreover, to reduce the number of defects in the multilayer reflective film, the multilayer reflective film must also be inspected for defects at an extremely high sensitivity. Doing this requires a reduction in noise and detection of pseudo-defects during the inspection, and which means that the smoothness of the surface of the multilayer reflective film itself is also required to be high.

Furthermore, it is well-known that when EUV light is used as the exposure light source, vacuum ultraviolet light and ultraviolet light (wavelength: 130 to 400 nm) are generated and these are referred to be as out-of-band (OoB) light. In EUV lithography reflective masks of a multilayer reflective film-etched light-shielding band-type described above, a substrate is exposed in the light-shielding band regions, and therefore, out-of-band light reflects off the substrate surface or passes through the substrate and then reflects off a conductive film formed on the rear surface of the substrate. Since the adjacent circuit pattern regions are to be exposed to light multiple times, the total amount of reflected out-of-band light is no longer negligible, and there will be a problem affecting the size of the wiring patterns.

The present invention was made in light of the foregoing and aims to provide a reflective mask blank and a method of manufacturing the same. The reflective mask blank prevents charge-up during the electron beam (EB) mask pattern defect inspection, minimizes phase defects, and makes it possible to form a multilayer reflective film with high surface smoothness. Also, the reflective mask blank minimizes the amount of out-of-band light that reflects off from the etched portions of the multilayer reflective film, and therefore, is suitable for manufacturing reflective masks having high mask pattern transfer precision. The present invention also aims to provide a reflective mask manufactured using the mask blank, a method of manufacturing the reflective mask, and a method of manufacturing a semiconductor device.

Solution to Problem

In order to solve the abovementioned problems, the present invention has the following configuration.

Configuration 1

A reflective mask blank including, a substrate, a conductive underlying film layered on the substrate, a multilayer reflective film for reflecting exposure light that is layered on the conductive underlying film, and an absorber film for absorbing exposure light that is layered on the multilayer reflective film, wherein the conductive underlying film is formed adjacent to the multilayer reflective film and is made of a tantalum-based material with a film thickness of greater than or equal to 1 nm and less than or equal to 10 nm.

Configuration 2

A reflective mask blank including, a substrate, a conductive underlying film layered on the substrate, a multilayer reflective film for reflecting exposure light that is layered on the conductive underlying film, and an absorber film for absorbing the exposure light that is layered on the multilayer reflective film, wherein the conductive underlying film is constituted by a laminated film including a layer of a tantalum-based material with a film thickness of greater than or equal to 1 nm and less than or equal to 10 nm that is formed adjacent to the multilayer reflective film and a layer of a conductive material that is formed between the layer of the tantalum-based material and the substrate.

Configuration 3

The reflective mask blank according to configuration 1 or 2, wherein the tantalum-based material contains at least one of nitrogen and oxygen.

Configuration 4

The reflective mask blank according to any one of configurations 1 to 3, further including:

a protective film formed on the multilayer reflective film, wherein the protective film is made of a ruthenium-based material.

Configuration 5

The reflective mask blank according to any one of configurations 1 to 4, wherein the multilayer reflective film is formed by alternately layering a first layers containing silicon and a second layer containing molybdenum, and a lowermost layer of the multilayer reflective film that contacts the conductive underlying film is the first layer.

Configuration 6

The reflective mask blank according to any one of configurations 1 to 4, wherein the multilayer reflective film is formed by alternately layering a first layer containing silicon and a second layer containing molybdenum, and a lowermost layer of the multilayer reflective film that contacts the conductive underlying film is the second layer.

Configuration 7

The reflective mask produced by using the reflective mask blank according to any one of configurations 1 to 6.

Configuration 8

A method of manufacturing a reflective mask, including:

preparing the reflective mask blank according to any one of configurations 1 to 6;

forming a resist pattern on the absorber film and then forming an absorber pattern by etching using the resist pattern as a mask, or forming a resist pattern after forming a hard mask film for etching on the absorber film and then forming an absorber pattern by etching using the hard mask to transfer the resist pattern to the absorber film; and dry etching a portion of the multilayer reflective film by using a chlorine-based gas that contains oxygen gas.

Configuration 9

The method of manufacturing the reflective mask according to configuration 8, wherein a location of the portion of the multilayer reflective film that is etched is a light-shielding band region formed so as to surround a circuit pattern region.

Configuration 10

The method of manufacturing the reflective mask according to configuration 8 or 9, wherein a protective film made of a ruthenium-based material is formed on the multilayer reflective film, and the protective film and the multilayer reflective film are dry-etched successively.

Configuration 11

A method of manufacturing a semiconductor device using the reflective mask according to configuration 7 or using the reflective mask manufactured by the method according to any one of configurations 8 to 10, including:

transferring a pattern formed on the reflective mask to a resist film formed on a semiconductor substrate by light exposure.

Configuration 12

A reflective mask blank including, a substrate, a conductive underlying film layered on the substrate, a multilayer reflective film for reflecting exposure light that is layered on the conductive underlying film, and an absorber film for absorbing exposure light that is layered on the multilayer reflective film, wherein the conductive underlying film is formed adjacent to the multilayer reflective film and is made of a ruthenium-based material with a film thickness of greater than or equal to 1 nm and less than or equal to 10 nm.

Configuration 13

The reflective mask blank according to configuration 12, further including:

a buffer film formed between the conductive underlying film and the substrate in order to buffer negative effects caused by defects or roughness on a surface of the substrate against a surface of the multilayer reflective film.

Configuration 14

The reflective mask blank according to configuration 12 or 13, further including:

a protective film formed on the multilayer reflective film, wherein the protective film is made of a ruthenium-based material.

Configuration 15

The reflective mask blank according to configuration 14, wherein the ruthenium-based material contains titanium.

Configuration 16

A method of manufacturing a reflective mask blank, comprising the steps of:

forming a conductive underlying film on a substrate by using a sputtering process;

forming a multilayer reflective film that reflects exposure light adjacent to the conductive underlying film; and forming an absorber film that absorbs exposure light, wherein the conductive underlying film is made of a ruthenium-based material with a film thickness of greater than or equal to 1 nm and less than or equal to 10 nm.

Configuration 17

The method of manufacturing the reflective mask blank according to configuration 16, wherein the conductive underlying film is formed by using an ion beam sputtering process.

Configuration 18

The method of manufacturing the reflective mask blank according to configuration 16 or 17, wherein the conductive underlying film is formed by sputtering particles of a material used for the conductive underlying film at an angle of incidence of less than or equal to 45° relative to a normal to a principal surface of the substrate.

Configuration 19

The method of manufacturing the reflective mask blank according to any one of configurations 16 to 18, wherein the forming of the conductive underlying film and the forming of the multilayer reflective film are performed successively under the same vacuum conditions.

Configuration 20

The method of manufacturing the reflective mask blank according to any one of configurations 16 to 19, further comprising the steps of:

forming a protective film on the multilayer reflective film after the forming of the multilayer reflective film, wherein the protective film is made of a ruthenium-based material.

Configuration 21

The method of manufacturing the reflective mask blank according to configuration 20, wherein the ruthenium-based material contains titanium.

Configuration 22

The method of manufacturing the reflective mask blank according to configuration 20 or 21, wherein an annealing process is conducted at a temperature of higher than or equal to 100° C. and lower than or equal to 300° C. after the formation of the protective film on the multilayer reflective film.

Configuration 23

A method of manufacturing a reflective mask, including:

preparing the reflective mask blank according to any one of configurations 12 to 15;

forming a resist pattern on the absorber film and then forming an absorber pattern by etching using the resist pattern as a mask, or forming a resist pattern after forming a hard mask film for etching on the absorber film and then forming an absorber pattern by etching using the hard mask to transfer the resist pattern to the absorber film; and etching a portion of the multilayer reflective film.

Configuration 24

The method of manufacturing the reflective mask according to configuration 23, wherein a location of the portion of the multilayer reflective film that is etched is a light-shielding band region formed so as to surround a circuit pattern region.

Configuration 25

A method of manufacturing a semiconductor device using the reflective mask manufactured by the method according to configuration 23 or 24, including:

transferring a pattern formed on the reflective mask to a resist film formed on a semiconductor substrate by light exposure.

Advantageous Effects of Invention

The reflective mask blank according to the present invention includes a conductive underlying film formed on a substrate and adjacent to a multilayer reflective film, the conductive underlying film being made of a tantalum-based material or a ruthenium-based material with a film thickness of greater than or equal to 1 nm, or a laminated conductive underlying film constituted by a tantalum-based material film (layer) made of a tantalum-based material that is formed adjacent to the multilayer reflective film and a conductive film (layer) that is formed between the tantalum-based material film and the substrate. This makes it possible to establish an electrical ground without a circuit pattern formation region being electrically isolated, thereby making it possible to prevent charge-up during a mask pattern defect inspection using electron beams (EB). Therefore, it becomes possible to perform high-sensitivity, high-stable mask pattern EB defect inspections.

Here, the tantalum-based material exhibits high dry etching resistance to dry etching processes performed using chlorine-based gases that contain oxygen gas, which are used to etch the multilayer reflective film. When a portion of the multilayer reflective film is etched using a chlorine-based gas that contains oxygen gas to form a light-shielding band, the tantalum-based material undergoes substantially no etching. Therefore, it becomes possible to ensure the conductivity required for the mask pattern EB defect inspection by having the tantalum-based material with the film thickness of greater than or equal to 1 nm.

Moreover, the film thickness of the tantalum-based material film or the ruthenium-based material in the conductive underlying film or the laminated conductive underlying film is less than or equal to 10 nm. This makes it possible to reduce the grain size and achieve a high degree of smoothness, thereby reducing the number of phase defects in the multilayer reflective film which is formed on top of the conductive underlying film or the laminated conductive underlying film. In addition, this ensures a high degree of surface smoothness of the multilayer reflective film as well, thereby reducing the number of pseudo-defects when the multilayer reflective film is inspected for defects. Also, it becomes possible to perform high-sensitivity defect inspections on the multilayer reflective film. Furthermore, in the case when a tantalum-based material film is used, by setting the film thickness to be less than or equal to 10 nm, the reflectance to out-of-band light in regions such as the light-shielding band or the like in which the tantalum-based material film is exposed after the multilayer reflective film is removed by etching is sufficiently so small that the reflectance does not negatively affect exposure transfer processes.

The method of manufacturing the reflective mask according to the present invention makes it possible to perform high-sensitivity defect inspections on the mask pattern and on the multilayer reflective film. Also, the incidence of phase defects in the multilayer reflective film is few, thereby making it possible to manufacture a mask that has few defects. Moreover, by using this reflective mask in EUV lithography processes, it becomes possible to provide a method of manufacturing a semiconductor device with few transfer defects.

BRIEF DESCRIPTION OF DRAWINGS

FIG. 1 is a cross-sectional view schematically illustrating a configuration of main components of a first EUV lithography reflective mask blank according to the present invention.

FIG. 2 is a cross-sectional view schematically illustrating a configuration of main components of a second EUV lithography reflective mask blank according to the present invention.

FIG. 3 is a cross-sectional view schematically illustrating a configuration of main components of a fourth EUV lithography reflective mask blank according to the present invention.

FIGS. 4(a) to 4(i) are process diagrams including cross-sectional views of primary steps in manufacturing an EUV lithography reflective mask from the first EUV lithography reflective mask blank according to the present invention.

FIGS. 5(a) and 5(b) are plane views schematically illustrating the configuration of the main components of an EUV lithography reflective mask according to the present invention.

FIG. 6 is a characteristic diagram illustrating the electrical properties of a conductive Ru film in terms of the relationship between the film thickness and the sheet resistance.

DESCRIPTION OF EMBODIMENTS

Next, embodiments of the present invention will be described in detail with reference to figures. Note that the embodiments described below are only examples of the present invention, and the present invention is not limited to these embodiments in any way. Also, Note that the same reference characters are used for components that are the same or equivalent in the figures, and duplicate descriptions of such components will be simplified or omitted.

Configuration of Reflective Mask Blank and Method of Manufacturing Reflective Mask Blank FIG. 1 is a cross-sectional view illustrating a configuration of main components of a first EUV lithography reflective mask blank according to the present invention. As illustrated in FIG. 1, a reflective mask blank 100 includes a substrate 1, a conductive underlying film 4 formed on a first principal surface (front surface) side of the substrate 1, the underlying film 4 being made of a tantalum-based material and having a film thickness of greater than or equal to 1 nm and less than or equal to 10 nm, a multilayer reflective film 5 that reflects EUV light as exposure light, a protective film 6 that is made primarily of ruthenium (Ru) and protects the multilayer reflective film 5, and an absorber film 7 that absorbs the EUV light, and these are all layered together in that order. Moreover, a rear surface conductive film 2 for electrostatic chucking is formed on a second principal surface (rear surface) side of the substrate 1.

FIG. 2 is a cross-sectional view illustrating a configuration of the main components of a second EUV lithography reflective mask blank according to the present invention. Unlike the first configuration of the EUV lithography reflective mask blank, the second configuration includes a laminated conductive underlying film 3 made of a plurality of layers (two layers shown as a representative example in FIG. 2) instead of the single-layer conductive underlying film 4 of the first configuration which is made of a tantalum-based material and has a film thickness of greater than or equal to 1 nm and less than or equal to 10 nm. The rest of the second configuration is the same as the first configuration of the reflective mask blank. Here, an uppermost layer 32 of the laminated conductive underlying film 3, that is, the layer that contacts the multilayer reflective film 5 is made of a tantalum-based material and has a film thickness of greater than or equal to 1 nm and less than or equal to 10 nm. Also, a film formed between the uppermost layer 32 and the substrate 1 is a conductive material layer (a conductive film 31). The uppermost layer 32 has to be resistant to etching of the multilayer reflective film 5. Also, the uppermost layer 32 may be conductive. The conductive film 31 may be a single-layer conductive film or a multilayer conductive film.

In the second EUV lithography reflective mask blank 101, by allowing the uppermost layer 32 to function as an etching stopper when the multilayer reflective film 5 is etched, the laminated conductive underlying film 3 can let the conductive film 31 function as a dedicated conductive layer. This allows the adjusting range of the conductivity of the second EUV lithography reflective mask blank to be wider than that of the first EUV lithography reflective mask blank, thereby making it possible to achieve the higher conductivity, as well as to surely prevent charge-up during the mask pattern defect inspections conducted using a high-current electron beam (EB). For this reason, the second EUV lithography reflective mask blank 101 makes it possible to further improve the inspection sensitivity and increase throughput during the mask pattern defect inspections. Meanwhile, in the first EUV lithography reflective mask blank 100, the conductive underlying film 4 is a single-layer film, which simplifies the manufacturing process and results in improved manufacturability.

A third EUV lithography reflective mask blank according to the present invention is different than the first EUV lithography reflective mask blank (FIG. 1) in that a conductive underlying film 4 is made of a ruthenium-based material that has a film thickness of greater than or equal to 1 nm and less than or equal to 10 nm. The rest of the third configuration is the same as the configuration of the first EUV lithography reflective mask blank.

FIG. 3 is a cross-sectional view illustrating a configuration of the main components of a fourth EUV lithography reflective mask blank according to the present invention. Unlike the third configuration of the EUV lithography reflective mask blank, the fourth configuration further includes a buffer film 10 between a substrate 1 and a conductive underlying film 4 for increasing the surface smoothness. The rest of the fourth configuration is the same as the configuration of the third reflective mask blank. In the fourth EUV lithography reflective mask blank 102, the buffer film 10 makes it possible to form the multilayer reflective film 5 on a highly smooth surface, thereby making it possible to form a multilayer reflective film 5 that exhibits few phase defects.

Next, each layer will be described in more detail.

Substrate

In order to prevent warping of absorber patterns due to the heat generated during EUV exposure, it is preferable that a material with a low coefficient of thermal expansion in the range of 0±5 ppb/° C. be used for the substrate 1. Examples of materials that have a low coefficient of thermal expansion in this range include, for example, $SiO_2$—$TiO_2$ glasses, multicomponent glass ceramics, and the like.

A surface treatment is applied to the first principal surface of the substrate 1 (that is, the side on which the transfer pattern (formed on an absorber film 7 which will be described below) is formed) in order to achieve the high degree of planarization (flatness) required to achieve at least the desired pattern transfer precision and the positioning precision. For EUV exposure, it is preferable that the flatness in a 132 mm×132 mm region on the principal surface of the substrate 1 on which the transfer pattern will be formed be less than or equal to 0.1 μm. It is more preferable that the flatness be less than or equal to 0.05 μm, and it is even more preferable that the flatness be less than or equal to 0.03 μm. Moreover, the second principal surface that is opposite to the side on which the absorber film 7 is formed is the surface that is electrostatically chucked when being set on the exposure device. It is preferable that the flatness of this surface in the 132 mm×132 mm region be less than or equal to 0.1 μm, more preferable that the flatness be less than or equal to 0.05 μm, and even more preferable that the flatness be less than or equal to 0.03 μm. Furthermore, it is preferable that the flatness of the second principal surface in a 142 mm×142 mm region of the reflective mask blank be less than or equal to 1 μm. It is more preferable that the flatness be less than or equal to 0.5 μm, and it is even more preferable that the flatness be less than or equal to 0.3 μm.

It is also extremely important that the surface smoothness of the substrate 1 be high as well. Therefore, it is preferable that the root mean square (RMS) surface roughness of the first principal surface on which the transfer absorber pattern is to be formed be less than or equal to 0.15 nm, and more preferable that the RMS surface roughness be less than or equal to 0.10 nm. Here, the surface smoothness can be measured by using an atomic force microscope.

Furthermore, it is preferable that the substrate 1 exhibits a high degree of rigidity in order to prevent any deformation of the films formed on the substrate 1 (such as the multilayer reflective film 5) due to film stress. More specifically, it is preferable that the Young's modulus of the substrate 1 be greater than or equal to 65 GPa.

Conductive Underlying Film

The conductive underlying film is a film that is formed between the substrate 1 and the multilayer reflective film 5, and contacts the multilayer reflective film 5.

Configuration in which Conductive Underlying Film is Made of Tantalum-Based Material The reflective mask blank 100 illustrated in FIG. 1 includes the single-layer conductive underlying film 4, while the reflective mask blank 101 illustrated in FIG. 2 includes the laminated conductive underlying film 3 that is made of a plurality of layers. Here, in both the single-layer conductive underlying film 4 and the laminated conductive underlying film 3 that includes a plurality of layers, the film (layer) that contacts the multilayer reflective film 5 is made of a tantalum-based material with a film thickness of greater than or equal to 1 nm and less than or equal to 10 nm. A tantalum-based material with a film thickness of greater than or equal to 1 nm and less than or equal to 10 nm offers the necessary conductivity, and also exhibits sufficiently low stress.

As described above, the conductive underlying film 4 and the uppermost layer 32 of the laminated conductive underlying film 3 are formed adjacent to the multilayer reflective film 5, and are made of a tantalum (Ta)-based material with a film thickness of greater than or equal to 1 nm and less than or equal to 10 nm. Ta exhibits extremely high dry etching resistance to dry etching processes performed by using chlorine-based gases that contain oxygen gas. Therefore, when a portion of the multilayer reflective film 5 is etched by using a chlorine-based gas that contains oxygen gas to form a light-shielding band 11, the conductive underlying film 4 and the uppermost layer 32 of the laminated conductive underlying film 3 that are made of a Ta-based material undergo substantially no etching; that is, any reduction in the film thickness can be ignored. Due to this high etching resistance of the conductive underlying film 4 and the uppermost layer 32 of the laminated conductive underlying film 3 and due to the inherent conductivity of Ta, it becomes possible to achieve the level of conductivity required to prevent charge-up by setting the film thickness of the Ta-based material to be greater than or equal to 1 nm. For the single-layer conductive underlying film 4, it is preferable that the film thickness is greater than or equal to 3 nm, and more preferable that the film thickness be greater than or equal to 4 nm in order to give sufficient conductivity to a single-layer film. Furthermore, when the conductive underlying film 4 and the uppermost layer 32 of the laminated conductive underlying film 3, that are made of a Ta-based material, have a film thickness of less than or equal to 10 nm, the size of grains is small. This makes it possible to achieve sufficiently high smoothness of the surface of the Ta-based material, and also improves the smoothness of the multilayer reflective film 5 that is formed on that surface, thereby making it possible to reduce the occurrence of phase defects. The resulting smoothness of the multilayer reflective film 5 also has the effect of reducing pseudo-defects when the multilayer reflective film 5 is inspected for defects. In addition, by setting the film thickness of the tantalum-based material film to be less than or equal to 10 nm, the reflectance of out-of-band light becomes sufficiently so small that the reflectance of out-of-band light does not give any negative effects to the exposure processes for transferring patterns. In order to minimize the amount of out-of-band light, it is preferable that the film thickness be less than or equal to 5 nm, and more preferable that the film thickness be less than or equal to 3 nm. In the case when the film thickness of the tantalum film is 3 nm, the reflectance of the light with a wavelength of 130 nm to 400 nm is 17%.

A sputtering process is used to form the conductive underlying film 4 and the uppermost layer 32 of the laminated conductive underlying film 3. More particularly, it is preferable that an ion beam sputtering process be used because this makes it possible to increase the surface smoothness of the conductive underlying film 4. Furthermore, it is preferable that the sputtering particles of the material used to form the conductive underlying film 4 and the uppermost layer 32 of the laminated conductive underlying film 3 (here, Ta) be sputtered at an angle of incidence of less than or equal to 45° relative to the normal to the principal surface of the substrate 1. This makes it possible to achieve more significant improvements in the surface smoothness.

The conductive underlying film 4 and the uppermost layer 32 of the laminated conductive underlying film 3 are made of a material composed primarily of tantalum. This material may be pure Ta metal or may be a Ta alloy that includes other metals such as titanium (Ti), niobium (Nb), molybdenum (Mo), zirconium (Zr), yttrium (Y), boron (B), lanthanum (La), cobalt (Co), or rhenium (Re) in addition to Ta.

Such a Ta alloy should have a Ta content ratio of greater than or equal to 50 at. % and less than 100 at. %. It is preferable that the Ta content ratio be greater than or equal to 80 at. % and less than 100 at. %, and more preferable that the content ratio be greater than or equal to 95 at. % and less than 100 at. %. In particular, in cases when Ta content ratios are greater than or equal to 95 at. % and less than 100 at. %, the film will have the excellent resistance to mask cleaning processes, and the excellent etching stopper functionality on etching the multilayer reflective film 5.

It is preferable that a tantalum compound that contains nitrogen (N) be used for the conductive underlying film 4 and the uppermost layer 32 of the laminated conductive underlying film 3. As a tantalum compound, O or B may be further added to a tantalum compound of a pure Ta metal and N or a tantalum compound of any Ta alloys described above and N. It is preferable that the nitrogen content be greater than or equal to 10 at. % and less than or equal to 30 at. %. The addition of nitrogen produces a microcrystalline film, which makes it possible to reduce the surface roughness of the conductive underlying film 4 and the uppermost layer 32 of the laminated conductive underlying film 3, thereby making it possible to increase the surface smoothness. Meanwhile, if a content ratio of nitrogen is too high, a polycrystalline film with a high surface roughness will be produced. Moreover, Ta is an element that is prone to oxidation, and therefore, adding nitrogen improves resistance to mask cleaning processes in comparison with that of pure Ta. Furthermore, adding nitrogen makes it possible to reduce the reflectance of out-of-band light in comparison to that of pure Ta. In order to further reduce the amount of out-of-band light, it is preferable that the uppermost layer 32 of the laminated conductive underlying film 3 be made of a tantalum compound that contains oxygen (O), such as TaO or TaON. It is preferable that the oxygen content be greater than or equal to 50 at. %. Moreover, as the film thickness of the laminated conductive underlying film 3 gets thinner, the reflectance of out-of-band light with a wavelength of less than or equal to 280 nm that does not pass through the substrate 1 can be smaller. Therefore it is more preferable that the film thickness be 1 to 6 nm. Meanwhile, for example, in the case of using TaO, as the film thickness of the laminated conductive underlying film 3 gets thicker, the reflectance of out-of-band light with a wavelength of 280 nm or greater that passes through the substrate 1 and reflects off the rear surface conductive film 2 tends to be smaller. Therefore, it is more preferable that the film thickness be 4 to 10 nm. In the case of making the uppermost layer 32 of the laminated conductive underlying film 3 function as a dedicated etching stopper, a tantalum compound that contains oxygen (O) or nitrogen (N), and has a lower conductivity than the materials used for the conductive underlying film 4 and the conductive film 31 (described below) of the laminated conductive underlying film 3 may be used for the uppermost layer 32.

The material used for the conductive film 31 (a layer of a conductive material) of the laminated conductive underlying film 3 is not particularly limited as long as the resulting film has a smooth surface and high conductivity. For example, the material may be a pure metal such as tantalum (Ta), ruthenium (Ru), titanium (Ti), tungsten (W), chromium (Cr), molybdenum (Mo), rhodium (Rh), platinum (Pt), zirconium (Zr), niobium (Nb), yttrium (Y), boron (B), lanthanum (La), cobalt (Co), or rhenium (Re); a Ta alloy that contains a metal such as titanium (Ti), niobium (Nb), molybdenum (Mo), zirconium (Zr), yttrium (Y), boron (B), lanthanum (La), cobalt (Co), or rhenium (Re) in addition to Ta; or another alloy such as an Ru alloy that contains an element such as titanium (Ti), niobium (Nb), molybdenum (Mo), zirconium (Zr), yttrium (Y), boron (B), lanthanum (La), cobalt (Co), or rhenium (Re) in addition to Ru. Moreover, it is also preferable that nitrogen be added to these metals or alloys because doing this reduces the surface roughness of the resulting conductive film 31, thereby increasing its smoothness. Here, the uppermost layer 32 that is formed on the conductive film 31 functions as an etching stopper when the multilayer reflective film 5 is etched, and therefore, the etching property for the conductive film 31 is not particularly necessary for consideration.

The film thickness of the conductive film 31 of the laminated conductive underlying film 3 is set such that the overall conductivity of the conductive film 31 and the uppermost layer 32 satisfies the required value, and such that the surface smoothness tolerance is satisfied. When the conductive film 31 is formed using a film formation method such as ion beam sputtering that utilizes particles of a small size, the lower limit of the film thickness is typically determined by the required conductivity, and the upper limit of the film thickness is determined by the required surface smoothness. For example, if the conductive film 31 is a Ru film formed using an ion beam sputtering process, it is preferable that the film thickness of the conductive film 31 be 1 nm to 5 nm.

There are various well-known methods in this technical field for forming the conductive film 31 of the laminated conductive underlying film 3, but here the conductive film 31 may be formed using an ion beam sputtering process, for example. Moreover, performing a precision polishing process or the like is effective for improving the smoothness of the conductive film 31. Moreover, when the film stress of the conductive film 31 is large, applying an annealing process to the conductive film 31 in order to flatten the overall mask blank makes it possible to effectively adjust the film stress.

Configuration in which Conductive Underlying Film is Made of Ruthenium-Based Material In the reflective mask blank 100 illustrated in FIG. 1, the conductive underlying film is formed directly on the substrate 1, while in the reflective mask blank 102 illustrated in FIG. 3, the conductive underlying film is formed directly on the buffer film 10 that is formed on the substrate 1. If the buffer film 10 is conductive, the buffer film 10 and the conductive underlying film 4 function together as an overall conductive underlying film for the multilayer reflective film 5. Here, however, the conductive underlying film 4 is simply described as a film that is formed on the buffer film 10 so as to contact the multilayer reflective film 5.

The conductive underlying film 4 is formed adjacent to the multilayer reflective film 5, and is made of a ruthenium (Ru)-based material with a film thickness of greater than or equal to 1 nm and less than or equal to 10 nm. Ru exhibits extremely high dry etching resistance to dry etching processes performed using chlorine-based gases. Therefore, when a portion of the multilayer reflective film 5 is etched by using a chlorine-based gas to form the light-shielding band 11, the conductive underlying film 4 that is made of an Ru-based material undergoes substantially no etching; that is, any reduction in the film thickness thereof can be ignored. Due to this high etching resistance of the conductive underlying film 4 and due to the inherent conductivity of Ru, it becomes possible to achieve the level of conductivity required to prevent charge-up by forming the conductive underlying film 4 from a Ru-based material with a film thickness of greater than or equal to 1 nm. For reference, FIG. 6 illustrates the relation between the sheet resistance and the Ru film thickness. Resistance increases rapidly when the film thickness is less than 1 nm. Furthermore, when the conductive underlying film 4 that is made of a Ru-based material has a film thickness of less than or equal to 10 nm, the size of grains is small. This makes it possible to achieve sufficiently high smoothness of the surface of the Ru-based material, thereby reducing the occurrence of phase defects in the multilayer reflective film 5 that is formed on that surface.

A sputtering process is used to form the conductive underlying film 4. More particularly, it is preferable that an ion beam sputtering process be used because this makes it possible to increase the surface smoothness of the conductive underlying film 4. Furthermore, it is preferable that the sputtering particles of the material used to form the conductive underlying film 4 (here, Ru) be sputtered at an angle of incidence of less than or equal to 45° relative to the normal to the principal surface of the substrate 1 because this makes it possible to achieve more significant improvements in the surface smoothness. For example, when Ru sputtering particles are sputtered at an angle of incidence of 50° relative to the normal to the principal surface of the substrate 1, the surface smoothness of the resulting Ru film is 0.15 nm (when the film thickness is set to be 2.5 nm). The surface smoothness can be improved to be 0.12 nm by sputtering the particles at an angle of incidence of 25°.

The conductive underlying film 4 is made of a material composed primarily of ruthenium. This material may be pure Ru metal or may be an Ru alloy that includes other metals such as titanium (Ti), niobium (Nb), molybdenum (Mo), zirconium (Zr), yttrium (Y), boron (B), lanthanum (La), cobalt (Co), or rhenium (Re) in addition to Ru. Moreover, nitrogen may also be contained.

Such a Ru alloy should have a Ru content ratio of greater than or equal to 50 at. % and less than 100 at. %. It is preferable that the Ru content ratio be greater than or equal to 80 at. % and less than 100 at. %, and more preferable that the content ratio be greater than or equal to 95 at. % and less than 100 at. %. In particular, when the Ru content ratios are greater than or equal to 95 at. % and less than 100 at. %, the resulting film has excellent resistance to mask cleaning processes and excellent etching stopper functionality on etching the multilayer reflective film 5.

Buffer Film

The buffer film 10 is a film with extremely high surface smoothness, and representative examples of materials that can be used include silicon (Si), laminated films, TaBN, and the like. For a laminated film, it is preferable to use a multilayer film of Mo and Si, which is also used for the multilayer reflective film 5, in terms of the equipment utilization efficiency and the quality control. In other words, by using the same materials for the multilayer reflective film 5 and the buffer film 10, it becomes possible to deposit the buffer film 10, the conductive underlying film 4, the multilayer reflective film 5, and the protective film 6 successively under the same vacuum conditions without a step of air releasing during the depositing process. This makes it possible to shorten the duration of the vacuum process, and to improve the quality by preventing adhesion of foreign materials as well as oxidation of the film surfaces. Here, formation of any oxide films would impede the etching process (reduce the etching rate) on etching by using a chlorine-based gas.

In a case of the multilayer buffer film 10 made of Si and Mo, when the conductive underlying film 4 is formed immediately after the formation of the multilayer buffer film 10 under the same vacuum conditions, it is preferable that the multilayer buffer film 10 has a Si/Mo multilayer structure in which a layer of Si and a layer of Mo are layered in that order from the substrate 1 side. If the Si/Mo multilayer structure in which a layer of Si and a layer of Mo are layered in that order is defined as one cycle, and multiple cycles are accumulated, the uppermost layer that contacts the conductive underlying film 4 will be a Mo layer. This is preferable because the Mo layer has low electrical resistance, which serves to enhance the charge-up prevention effect working with the conductive underlying film 4. Conversely, if a Mo/Si multilayer structure is defined as one cycle in which a layer of Mo and a layer of Si are layered in that order from the substrate 1 side, and multiple cycles are accumulated, the uppermost layer that contacts the conductive underlying film 4 will be a Si layer. The Si layer has relatively high electrical resistance, and therefore, in this case, it is preferable that an additional Mo layer be formed on the uppermost Si layer of the buffer film 10.

Meanwhile, if there is a process of air releasing after the formation of the multilayer buffer film 10 and then the conductive underlying film 4 is formed, an oxide film will be formed on the uppermost surface of the multilayer buffer film 10. Therefore it is preferable that a layer of Si be the uppermost layer of the multilayer buffer film 10 because an oxide film of a Si layer will be relatively thin. Here, if Si/Mo multilayer structures in which a layer of Si and a layer of Mo are layered in that order from the substrate 1 side are formed, the uppermost layer will be a Mo layer. Therefore it is preferable that an additional Si layer be formed on the uppermost Mo layer of the buffer film 10.

The laminated film described above includes the layers of Mo and Si, but a pure metal selected from ruthenium (Ru), rhodium (Rh), or platinum (Pt) or an alloy of these metals may be used instead of Mo. Moreover, as an alternative to the pure Si, a Si compound that contains boron (B), carbon (C), nitrogen (N), or oxygen (O) in addition to Si may be used.

There are various well-known methods in this technical field for forming the buffer film 10, but the buffer film 10 may be formed using an ion beam sputtering process, for example. Moreover, performing an annealing process, a precision polishing process, or the like is effective for improving the smoothness of the surface of the buffer film. Here, an annealing process is also effective in terms of flattening the mask blank by adjusting the film stress. Furthermore, the buffer film 10 may also be used in the configurations described above in which the conductive underlying film is made of a tantalum-based material.

Multilayer Reflective Film

The multilayer reflective film 5 provides the EUV lithography reflective mask the ability to reflect EUV light, and is a multilayer film formed by cyclically layering layers. Each layer is composed primarily of an element with a different refractive index.

Typically, the multilayer reflective film 5 is a multilayer film in which a thin film (a high refractive index layer) of a light element being a high refractive index material or a compound thereof, and another thin film (a low refractive index layer) of a heavy element being a low refractive index material or a compound thereof are alternately layered for approximately 40 to 60 cycles.

The multilayer film may be formed by repeatedly layering a cycle of a multilayer structure of high/low refractive index layers in which a high refractive index layer and a low refractive index layer are layered in that order from the conductive underlying film 4 side or from the uppermost layer 32 side of the laminated conductive underlying film 3. Also, the multilayer film may be formed by repeatedly layering a cycle of a multilayer structure of low/high refractive index layers in which a low refractive index layer and a high refractive index layer are layered in that order from the conductive underlying film 4 side or from the uppermost layer 32 side of the laminated conductive underlying film 3. Moreover, it is preferable that the uppermost layer of the multilayer reflective film 5, that is, the surface layer of the multilayer reflective film 5 that is opposite to the conductive underlying film 4 side or the uppermost layer 32 side of the laminated conductive underlying film 3, be a high refractive index layer. When the multilayer film described above is formed by repeatedly layering a cycle of a multilayer structure of high/low refractive index layers in which a high refractive index layer and a low refractive index layer are layered in that order from the conductive underlying film 4 side or from the uppermost layer 32 side of the laminated conductive underlying film 3, the uppermost layer of the multilayer film will be a low refractive index layer by default. However, when the uppermost layer of the multilayer reflective film 5 is a low refractive index layer, the uppermost layer is prone to oxidation, thereby reducing the reflectance of the reflective mask. Therefore, it is preferable that an additional high refractive index layer be formed on the uppermost low refractive index layer of the multilayer reflective film 5. Meanwhile, when the multilayer film described above is formed by repeatedly layering a cycle of a multilayer structure of low/high refractive index layer in which a low refractive index layer and a high refractive index layer are layered in that order from the conductive underlying film 4 side or from the uppermost layer 32 side of the laminated conductive underlying film 3, the uppermost layer will be a high refractive index layer by default, and therefore the configuration may simply be left as-is.

In the present embodiment, layers that contain silicon (Si) are used for the high refractive index layers. Here, the material that contains Si may be pure Si or may be a Si compound that contains boron (B), carbon (C), nitrogen (N), or oxygen (O) in addition to Si. Using layers that contain Si for the high refractive index layers makes it possible to produce an EUV lithography reflective mask with excellent reflectance of EUV light. Furthermore, a pure metal selected from molybdenum (Mo), ruthenium (Ru), rhodium (Rh), or platinum (Pt) or an alloy of these metals is used for the low refractive index layers. When the multilayer reflective film 5 is intended for use with EUV light with a wavelength of 13 nm to 14 nm, for example, it is preferable that the multilayer reflective film 5 be a Mo/Si cycle multilayer film in which a Mo film and a Si film are alternately layered for approximately 40 to 60 cycles. Moreover, when the uppermost layer of the multilayer reflective film 5 is a high refractive index layer that is made of silicon (Si), a silicon oxide layer that contains silicon and oxygen may be formed between that uppermost Si layer and the protective film 6. This makes it possible to improve resistance to mask cleaning processes.

The reflectance of this type of multilayer reflective film 5 by itself is normally greater than or equal to 65%, with a typical upper limit of 73%. Moreover, the thickness of each layer of the multilayer reflective film 5 as well as a cycle of layers may be selected as appropriate according to the exposure wavelength and so as to satisfy Bragg's law. Although the multilayer reflective film 5 includes a plurality of high refractive index layers and low refractive index layers, the thicknesses of all of the high refractive index layers and the thicknesses of all of the low refractive index layers do not necessarily need to be the same. Furthermore, the film thickness of the uppermost Si layer of the multilayer reflective film 5 may be adjusted within a range that does not result in a decrease in reflectance. Here, the film thickness of the uppermost Si layer (a high refractive index layer) may be 3 nm to 10 nm.

When the first layer of the multilayer reflective film 5 that is formed on the conductive underlying film 4 or the uppermost layer 32 of the laminated conductive underlying film 3 is a Mo layer, it is difficult to form a diffusion layer between the multilayer reflective film 5 and the conductive underlying film 4, which makes it difficult to adjust the electrical resistance. Conversely, when the first layer of the multilayer reflective film 5 that is formed on the conductive underlying film 4 or the uppermost layer 32 of the laminated conductive underlying film 3 is a Si layer, it is easy to form a TaSi diffusion layer (in the case when the conductive underlying film is made of a tantalum-based material) or an RuSi diffusion layer (in the case when the conductive underlying film is made of a ruthenium-based material) between the multilayer reflective film 5 and the conductive underlying film 4. When the conductive underlying film is made of a tantalum-based material, the surface of the conductive underlying film 4 or the uppermost layer 32 will be exposed at the time of forming the light-shielding band 11, and therefore, it is preferable that a TaSi diffusion layer be formed because this will prevent oxidation of the surface of the conductive underlying film 4 or the uppermost layer 32. When the conductive underlying film is made of a ruthenium-based material, it is not possible to completely remove a RuSi diffusion layer by etching for forming the light-shielding band 11, which negatively affects the electrical resistance. Therefore, the film thickness of the conductive underlying film 4 must be adjusted accordingly. Thus, when the lowermost layer of the multilayer reflective film 5 that is formed on the conductive underlying film 4 or on the uppermost layer 32 of the laminated conductive underlying film 3 is a Si layer, the Si layer must be formed approximately 0.5 nm thicker than the case when the lowermost layer is a Mo layer. It is preferable that the thickness of the diffusion layer be 0.5 nm to 1 nm. The film thickness of the diffusion layer can be controlled by controlling the power of an ion beam produced by an ion beam generation device when the conductive underlying film 4 or the uppermost layer 32 of the laminated conductive underlying film 3 is formed. Increasing the power of the ion beam makes it possible to increase the film thickness of the diffusion layer. The film thickness of the diffusion layer may also be controlled by adjusting the angle of incidence (that is, the angle of incidence relative to the normal to the principal surface of the substrate 1) of the sputtering particles produced when the ion beam from the ion beam generation device hits the target. As this angle of incidence gets closer to 0°, the film thickness of the diffusion layer can be thicker.

There are various well-known methods in this technical field for forming the multilayer reflective film 5, but here, the layers of the multilayer reflective film 5 may be formed by using an ion beam sputtering process, for example. In the case when the Mo/Si cycle multilayer film described above is formed, for example, when using an ion beam sputtering process, at first, a Si target is used to form a Si film with a thickness of approximately 4 nm on the conductive underlying film 4 or the laminated conductive underlying film 3. Then, a Mo target is used to form a Mo film with a thickness of approximately 3 nm. This cycle is then repeated 40 to 60 times to form the multilayer reflective film 5 (and the uppermost layer is formed to be a Si layer).

On forming the conductive underlying film 4 or the laminated conductive underlying film 3 and the multilayer reflective film 5, it is preferable that both films be formed successively under the same vacuum conditions. If the conductive underlying film 4 or the laminated conductive underlying film 3 is exposed to air or oxygen during this process, an oxide layer is formed on the surface of the tantalum-based material or the ruthenium-based material of the conductive underlying film 4 or the surface of the tantalum-based material of the uppermost layer 32 of the laminated conductive underlying film 3, which would result in a decrease in conductivity and the surface smoothness. Moreover, if the conductive underlying film is made of a ruthenium-based material, this oxidation would reduce the functionality as an etching stopper (that is, the etching resistance) at the time of forming the light-shielding band 11 in the multilayer reflective film 5 using a chlorine-based gas. A series of processes of vacuum drawing, air releasing, and then vacuum drawing increase the incidence of foreign material defects, while forming the films successively under the same vacuum conditions makes it possible to reduce the incidence of foreign material defects. Meanwhile, to achieve better equipment utilization efficiency when forming the conductive substrate film 4 or the multilayer conductive substrate film 3 and the multilayer reflective film 5, the assembly may be temporarily exposed to air and transferred to a different machine to form each film.

Protective Film

For example, the protective film 6 made of a material that contains ruthenium (Ru) is formed on the multilayer reflective film 5 in order to protect the multilayer reflective film 5 from dry etching and cleaning processes during a method of manufacturing the EUV lithography reflective mask (described below). The protective film 6 also protects the multilayer reflective film 5 at the time of fixing black defects in the mask pattern using an electron beam (EB). The protective film 6 is a single-layer film in the configurations illustrated in FIGS. 1 to 3, but may also have a multilayer structure that includes three or more layers. For example, the protective film 6 may include a lowermost layer and an uppermost layer that are both made of the abovementioned Ru-containing material as well as a middle layer made of a metal other than Ru or an alloy that is interposed between the lowermost layer and the uppermost layer. The protective film 6 is made of a material composed primarily of ruthenium, for example. This material may be pure Ru metal or may be an Ru alloy that includes other metals such as titanium (Ti), niobium (Nb), molybdenum (Mo), zirconium (Zr), yttrium (Y), boron (B), lanthanum (La), cobalt (Co), or rhenium (Re) in addition to Ru. Moreover, the selected material may also contain nitrogen. Here, using a Ru-based material that contains Ti for the protective film 6 is particularly effective in terms of reducing the diffusion of the silicon, which is an element in the multilayer reflective film, from the surface of the multilayer reflective film into the protective film 6. This prevents the surface roughness from getting worse during mask cleaning processes, and also makes the film less prone to peeling. Preventing the surface roughness from getting worse is directly related to preventing the reflectance to EUV exposure light from decreasing, and is therefore very important in terms of improving EUV exposure efficiency and throughput.

Such a Ru alloy should have a Ru content ratio of greater than or equal to 50 at. % and less than 100 at. %. It is preferable that the Ru content ratio be greater than or equal to 80 at. % and less than 100 at. %, and more preferable that the content ratio be greater than or equal to 95 at. % and less than 100 at. %. In particular, an Ru content ratio of greater than or equal to 95 at. % and less than 100 at. % makes it possible for the protective film to have good resistance to mask cleaning processes, to have a good etching stopper functionality at the time of etching the absorber film 7, and to have a protective film functionality to prevent the time-dependent deterioration of the multilayer reflective film, while also preventing the diffusion of the elements (silicon) in the multilayer reflective film into the protective film 6 and maintaining sufficient reflectance to EUV light.

In EUV lithography, there are few materials that are transparent to the exposure light, and therefore, providing an EUV pellicle that prevents adhesion of foreign materials to the mask pattern surface presents a technical challenge. Therefore, most fabrication processes are pellicleless processes that do not utilize a pellicle. Moreover, EUV lithography processes are prone to a problem known as exposure contamination in which carbon films are deposited or oxide films are formed on the mask due to the EUV exposure. Therefore, during a process in which a mask is used for manufacturing a semiconductor device, the mask must be cleaned frequently to remove foreign materials and contaminants on the mask. Thus, EUV reflective masks require significantly better resistance to mask cleaning processes than transmissive masks used in standard optical lithography. A protective film 6 made of a Ru-based material containing Ti exhibits particularly high resistance to cleaning processes performed by using cleaning solutions such as sulfuric acid, sulfuric acid peroxide mixtures (SPM), ammonia, ammonia peroxide mixtures (APM), OH radical cleaning solutions, and ozonized water with a concentration of less than or equal to 10 ppm, and it is possible to achieve the required resistance to mask cleaning processes.

The thickness of the protective film 6 is not particularly limited as long as the protective film 6 exhibits the required functionality, but in consideration of the reflectance to EUV light, it is preferable that the thickness be 1.0 nm to 8.0 nm, and more preferable that the thickness be 1.5 nm to 6.0 nm.

The method used to form the protective film 6 is not particularly limited, and any methods similar to well-known film forming methods may be used as-is. Specific examples of processes that can be used include a sputtering method and an ion beam sputtering method.

Once the protective film 6 is formed on the multilayer reflective film 5, it is preferable that a heat treatment (annealing) be applied at a temperature of higher than or equal to 100° C. and lower than or equal to 300° C., more preferable that the temperature be higher than or equal to 120° C. and lower than or equal to 250° C., and even more preferable that the temperature be higher than or equal to 150° C. and lower than or equal to 200° C. This annealing process reduces stress and the deterioration of flatness since stress or strain in the mask blank can be prevented. Also, it is possible to prevent time-dependent changes in the reflectance of the multilayer reflective film 5 to EUV light. In particular, when the protective film 6 is made of a RuTi alloy containing Ti, this annealing process significantly reduces the diffusion of Si from the multilayer reflective film 5, thereby making it possible to prevent the deterioration of reflectance to EUV light.

Absorber Film

The absorber film 7 is formed on the protective film 6 and absorbs EUV light. The absorber film 7 may be an absorber film 7 that is intended only to absorb EUV light or may be an absorber film 7 that also has a phase-shifting functionality to account for phase differences in the EUV light. Here, the "absorber film 7 that also has a phase-shifting functionality" refers to a film that absorbs EUV light and also reflects a portion of that light to shift the phase. In other words, in a reflective mask in which an absorber film 7 that also has a phase-shifting functionality is patterned, the portions in which the absorber film 7 is formed absorb EUV light and reduce the amount of EUV light, while also reflecting a part of the light in the level of not negatively affecting the pattern transfer process, thus creating the desired phase difference relative to the reflected light from a field portion that comes through the protective film 6 by reflecting off the multilayer reflective film 5. Here, the absorber film 7 that has a phase-shifting functionality is formed such that the phase difference between the reflected light from the absorber film 7 and the reflected light from the multilayer reflective film 5 comes to be 170° to 190°. These two types of light that have a phase difference of approximately 180° interfere with one another at the edges of the pattern, thereby improving the image contrast of the projected image. This increase in the image contrast increases the resolution and improves several exposure-related tolerances, such as exposure amount tolerance and focus tolerance.

The absorber film 7 may be a single-layer film or a laminated film that includes a plurality of films. Here, a single-layer film makes it possible to reduce the number of steps required to manufacture a mask blank, thereby increasing manufacturing efficiency. Meanwhile, when a laminated film is used, the optical constants and the film thickness of the uppermost film can be set appropriately such that the uppermost film can be an anti-reflective film at the time of the mask pattern inspecting using light. This increases inspection sensitivity at the time of inspecting the mask pattern using light. Moreover, using a film to which oxygen (O), nitrogen (N), or the like has been added to improve oxidation resistance for the upper layer makes it possible to increase aging stability. In this way, using a laminated film makes it possible to add various effects. When the absorber film 7 is an absorber film 7 that has a phase-shifting functionality, using a laminated film as the absorber film 7 increases the scope of optical adjustments that can be made, and thus it becomes easier to achieve the desired reflectance.

The material used for the absorber film 7 is not particularly limited as long as the absorber film 7 absorbs EUV light and the material can be processed using an etching process or the like (it is preferable that the material can be etched using a dry etching process with chlorine (Cl) or fluorine (F) gas). Examples of the materials that exhibit these properties and can be preferably used include pure tantalum (Ta) and tantalum compounds that are composed primarily of Ta.

The absorber film 7 made of tantalum or a tantalum compound can be formed using a well-known method including magnetron sputtering processes such as a DC sputtering or an RF sputtering. For example, the absorber film 7 can be formed on the protective film 6 using a reactive sputtering process that utilizes a tantalum-containing target, a boron-containing target, and argon gas to which oxygen or nitrogen has been added.

Here, "tantalum compounds" includes Ta alloys. From the perspectives of the surface smoothness and the flatness, it is preferable that the state of crystallinity of the absorber film 7 be amorphous or microcrystalline. If the surface of the absorber film 7 is not flat and smooth, this results in larger edge roughness of the absorber pattern and a decrease in the dimensional precision of the pattern. It is preferable that the root mean square (RMS) surface roughness of the absorber film 7 be less than or equal to 0.5 nm, more preferable that the RMS surface roughness be less than or equal to 0.4 nm, and even more preferable that the RMS surface roughness be less than or equal to 0.3 nm.

Examples of tantalum compounds that can be used include compounds that contain Ta and B, compounds that contain Ta and N, compounds that contain Ta, O and N, compounds that contain Ta and B and further include at least one of O and N, compounds that contain Ta and Si, compounds that contain Ta, Si and N, compounds that contain Ta and Ge, compounds that contain Ta, Ge and N, and the like.

Ta has a high absorption coefficient for EUV light and can easily be dry-etched with chlorine-based gases or fluorine-based gases, and therefore Ta offers excellent workability as an absorber film material. Furthermore, adding an element such as B, Si, Ge or the like to the Ta makes it easy to produce an amorphous material, thereby making it possible to increase the smoothness of the absorber film 7. Moreover, adding N or O to the Ta improves the oxidation resistance of the absorber film 7, thereby making it possible to increase the time-dependent stability of the film.

When the absorber film 7 includes a TaBN lower film and a TaBO upper film, and the film thickness of the TaBO upper film is set to be approximately 14 nm, the upper film effectively becomes an anti-reflective film and increases the inspection sensitivity when inspecting for mask pattern defects using light is performed.

Examples of the materials that can be used for the absorber film 7 other than tantalum and tantalum compounds include chromium and chromium compounds such as Cr, CrN, CrCON, CrCO, CrCOH, and CrCONH as well as materials such as WN, TiN, and Ti.

Rear Surface Conductive Film

The rear surface conductive film 2 for electrostatic chucking is formed on the second principal surface (rear surface) side of the substrate 1 (that is, on the side opposite to the surface on which the multilayer reflective film 5 is formed). The rear surface conductive film 2 for electrostatic chucking must have certain electrical properties; here, the sheet resistance must typically be less than or equal to $100\Omega/\square$. The rear surface conductive film 2 may be formed by a magnetron sputtering process or an ion beam sputtering process using a target of a metal or an alloy such as chromium or tantalum, for example. Representative examples of materials are CrN and Cr, which are frequently used in mask blank manufacturing processes for transmissive mask blanks and the like. The thickness of the rear surface conductive film 2 is not particularly limited as long as the film can satisfactorily function as an electrostatic chuck, but the thickness is normally set to be 10 nm to 200 nm. Furthermore, the rear surface conductive film 2 can also be used to adjust the stress of the second principal surface side of the reflective mask blank 100. Here, this stress can be adjusted so as to balance with the stress from the films formed on the first principal surface side in order to produce a flat reflective mask blank.

Etching Mask

In the reflective mask blank, a hard mask film for etching or a resist film may be formed on the absorber film 7. Representative examples of materials for the hard mask film for etching include silicon (Si); silicon materials to which oxygen (O), nitrogen (N), carbon (C), or hydrogen (H) have been added; and the like. Specific examples of such materials include $SiO_2$, SiON, SiN, SiO, Si, SiC, SiCO, SiCN, SiCON, and the like. However, if the absorber film 7 is made of an oxygen-containing compound, it is preferable that oxygen-containing materials such as $SiO_2$ be avoided for the hard mask film for etching in the view of the etching resistance. Forming a hard mask film for etching makes it possible to decrease the thickness of resist films, and is also advantageous in terms of facilitating pattern miniaturization.

Reflective Mask and Method of Manufacturing Reflective Mask

The reflective mask blank 100, 101, or 102 according to the present embodiments is used to manufacture a reflective mask. Here, a basic overview of this process will be provided, and the process will be described in more detail with reference to figures in the examples below.

First, the reflective mask blank 100, 101, or 102 is prepared, and a resist film is formed on the uppermost surface of the first principal surface of the reflective mask blank (that is, on the absorber film 7, as described in the working examples below) (This resist film is not needed if the reflective mask blank 100, 101, or 102 already includes a resist film). A desired pattern such as a circuit pattern is then drawn (exposed) onto the resist film, which is then developed and rinsed to form a predetermined resist pattern.

Next, by using this resist pattern as a mask, the absorber film 7 is dry-etched to form an absorber pattern. The etching gas may be chlorine-based gases such as $Cl_2$, $SiCl_4$, or $CHCl_3$; mixed gases containing the chlorine-based gases and $O_2$ in a predetermined ratio; mixed gases containing the chlorine-based gas and He in a predetermined ratio; mixed gases containing the chlorine-based gas and Ar in a predetermined ratio; fluorine-based gases such as $CF_4$, $CHF_3$, $C_2F_6$, $C_3F_6$, $C_4F_6$, $C_4F_8$, $CH_2F_2$, $CH_3F$, $C_3F_8$, $SF_6$, or $F_2$; mixed gases containing the fluorine-based gases and $O_2$ in a predetermined ratio; or the like. Here, using an etching gas that contains oxygen in the final etching step will cause an increase in the surface roughness of the Ru protective film 6. Therefore, it is preferable that an etching gas that does not contain oxygen be used in any over-etching processes in which the Ru protective film 6 is directly exposed to the etching. Then, the resist pattern is removed using an ashing process or a resist stripping solution, and the absorber pattern in which the desired circuit pattern is formed is completed.

Although a resist is used as the etching mask in the process described above, the absorber pattern in which the desired circuit pattern is formed may also be produced using a hard mask for etching. In this case, the hard mask for etching is formed on the absorber film 7, and then, a resist film is formed on the hard mask. Here, a film that exhibits the appropriate etching selectivity relative to the absorber film 7 is used for the hard mask for etching. Next, a desired pattern such as a circuit pattern is drawn (exposed) onto the resist film, which is then developed and rinsed to form a predetermined resist pattern. Then, by using this resist pattern as a mask, the hard mask film for etching is dry-etched to form a hard mask pattern, and the resist pattern is removed using an ashing process or a resist stripping solution, for example. Next, by using this hard mask pattern as a mask, the absorber film 7 is dry-etched to produce an absorber pattern in which the desired circuit pattern is formed. Then, the hard mask pattern is removed using a wet etching process or a dry etching process.

Moreover, the resist pattern does not necessarily need to be removed immediately after the hard mask pattern is formed, and the absorber film 7 may be etched using a hard mask pattern that still has the resist pattern formed thereon. In this case, the resist pattern gets removed automatically when the absorber film 7 is etched, thereby making it possible to simplify the process. On the other hand, in the method of etching the absorber film 7 using the hard mask pattern from which the resist pattern has already been removed as the mask, there will be no changes relating to organic byproducts (outgas sing) which would be generated from the resist which would be removed during the etching process, thereby making it possible to etch the film in a more stable manner.

Next, another resist film is formed, and a light-shielding band pattern is drawn (exposed) onto the resist film, which is then developed and rinsed to form a resist pattern for forming the light-shielding band. By using this resist pattern for forming the light-shielding band as a mask, the absorber film 7 is dry-etched using the method described above, and then the protective film 6 and the multilayer reflective film 5 are dry-etched as well. Here, when the conductive underlying film is made of a tantalum-based material, the mixed gases that contain chlorine-based gas such as $Cl_2$, $SiCl_4$, or $CHCl_3$ as well as $O_2$ is used as the etching gas for the protective film 6 and the multilayer reflective film 5. The mixture ratio of the chlorine-based gas and the $O_2$ gas can be set as appropriate according to the relationship between the etching rate of the target film and the etching rate of the tantalum-based material used to form the conductive underlying film 4 or the uppermost layer 32 of the laminated conductive underlying film 3 that functions as an etching stopper. When the protective film 6 is made of a Ru-based material, the protective film 6 and the multilayer reflective film 5 can both be etched at the same time using a dry etching process that utilizes the mixed gases containing chlorine-based gas and $O_2$, thereby resulting in a high manufacturing efficiency. Alternatively, the protective film and the multilayer reflective film can be dry-etched separately using different etching gases instead of both being dry-etched at the same time. As another alternative, the etching gas can be changed in the middle of the process of dry etching the multilayer reflective film. For example, the upper portion of the multilayer reflective film may be etched using chlorine-based gas, and then $O_2$ gas may be introduced and the lower portion of the multilayer reflective film may be dry-etched using the mixed gases that contain the chlorine-based gas and the $O_2$ gas. When the conductive underlying film 4 is made of a ruthenium-based material, chlorine-based gas or fluorine-based gas or the like may be used as the etching gas as appropriate. However, using an etching gas that contains oxygen in the final etching step will cause an increase in the surface roughness of the conductive underlying film 4. The conductive underlying film 4 is a thin film, and therefore, the increase in surface roughness and surface oxidation results in increasing sheet resistance, which reduces the film's ability to prevent charge-up during mask pattern EB defect inspections. Therefore, it is preferable that an etching gas that does not contain oxygen be used in any over-etching processes in which the conductive underlying film 4 is directly exposed to the etching. Next, the resist pattern is removed using an ashing process or a resist stripping solution, and the desired light-shielding band pattern is completed. Then, a wet cleaning process is performed using an acidic or alkaline aqueous solution, the mask pattern EB defect inspection is conducted, and any mask defects are fixed as appropriate.

In the process described above, the circuit pattern formation region is electrically connected to a ground portion arranged outside of the light-shielding band 11 through the conductive underlying film 4 or the laminated conductive underlying film 3 at the low sheet resistance. This makes it possible to prevent charge-up during the mask pattern EB defect inspections, and also makes it possible to achieve high sensitivity in the pattern defect inspections. Moreover, the multilayer reflective film 5 will exhibit few phase defects because the multilayer reflective film 5 is formed on the conductive underlying film 4 or the laminated conductive underlying film 3 which has an extremely smooth surface, or because the multilayer reflective film 5 is formed on an extremely smooth film due to having the buffer film 10 which has an extremely smooth surface. Furthermore, since the surface smoothness of the multilayer reflective film 5 is enhanced, background noise during multilayer film defect inspections using light with a wavelength such as 193 nm is reduced, thereby reducing the number of pseudo-defects and improving the defect inspection sensitivity of the multilayer reflective film 5. Because of the defect inspections of the mask pattern and the multilayer reflective film 5 at the high sensitivity as well as few phase defects in the multilayer reflective film 5, a multilayer reflective film-etched light-shielding band-type reflective mask (EUV lithography reflective mask) with few defects can be obtained. Moreover, although a case of the multilayer reflective film-etched light-shielding band structure is described here, the same advantageous effects can be seen in a case of a configuration which does not have a multilayer reflective film etched portion by using the structure and the manufacturing method of the present invention. This is because the conductivity of any mask blanks is increased and a multilayer reflective film 5 with few defects can be offered by using the structure and the manufacturing method of the present invention.

Method of Manufacturing Semiconductor Device

Conducting an EUV exposure process using the reflective mask according to the embodiment described above makes it possible to form a desired transfer pattern on a semiconductor substrate. Here, the multilayer reflective film 5 and the mask pattern both have few defects, and therefore, there will also be few transfer defects. By conducting various processes other than this lithography process such as etching target films, forming insulating films and conductive films, introducing dopants, annealing, and the like, it is possible to manufacture semiconductor devices in which the desired electronic circuits are formed at a high yield rate.

EXAMPLES

Next, examples will be described with reference to the figures. Note that the same reference characters will be used for components that are the same in each example, and duplicate descriptions of such a component will be simplified or omitted.

Example 1

FIG. 4 shows a series of cross-sectional views schematically illustrating the primary steps in manufacturing an EUV lithography reflective mask 200 from an EUV lithography reflective mask blank 100.

As illustrated in FIG. 4(*a*), the reflective mask blank 100 according to Example 1 includes a rear surface conductive film 2, a substrate 1, a single-layer conductive underlying film 4, a multilayer reflective film 5, a protective film 6, and an absorber film 7. Here, the absorber film 7 is a two-layer film that includes a lower absorber film 71 made of TaBN and an upper absorber film 72 made of TaBO. First, the reflective mask blank itself will be described.

Reflective Mask Blank

Substrate

The substrate 1 was an $SiO_2$—$TiO_2$ low thermal expansion glass substrate having the 6025 size (approximately 152 mm×152 mm×6.35 mm) in which both the first principal surface and the second principal surface were polished. Here, the polishing process included a rough polishing step, a precision polishing step, a local polishing step, and a touch polishing step to ensure that the principal surfaces were flat and smooth.

Rear Surface Conductive Film

The rear surface conductive film 2 made of CrN was formed on the second principal surface (the rear surface) of the $SiO_2$—$TiO_2$ glass substrate 1 using a magnetron sputtering (reactive sputtering) process under the following conditions. The rear surface conductive film formation conditions include a Cr target, a mixed gas atmosphere of Ar and $N_2$ (Ar: 90 at. %, N: 10 at. %), and film thickness of 20 nm.

Conductive Underlying Film

Next, an ion beam sputtering process was performed using a Ta target in an Ar gas atmosphere to form the conductive underlying film 4 made of a Ta film with a film thickness of 4 nm on the principal surface (the first principal surface) of the substrate 1 which is opposite to the side on which the rear surface conductive film 2 was formed. Here, the Ta sputtering particles were sputtered at an angle of incidence of 30° relative to the normal to the principal surface of the substrate 1. When the sheet resistance of a sample produced using the same method up through the formation of the conductive underlying film 4 was measured, the sheet resistance of the conductive underlying film 4 was 600Ω/□, which was a sufficiently low sheet resistance for preventing charge-up during mask pattern EB defect inspections. The RMS surface roughness was 0.13 nm. Here, the surface roughness was measured using an atomic force microscope (AFM) in a 1 μm×1 μm region in the center of the substrate.

Multilayer Reflective Film

Next, the multilayer reflective film 5 was formed on the conductive underlying film 4 without air releasing in the middle of the process for preventing oxidation. In other words, the multilayer reflective film 5 was formed immediately after the conductive underlying film 4 forming process under the same vacuum conditions. The multilayer reflective film 5 was formed as a Si/Mo cycle multilayer reflective film including a plurality of Si and Mo layers in order to produce a multilayer reflective film suitable for the exposure to EUV light with a wavelength of 13.5 nm. By performing an ion beam sputtering process using a Si target and a Mo target in an Ar gas atmosphere, the multilayer reflective film 5 was formed by alternately layering a Si layer and a Mo layer onto the conductive underlying film 4. Here, the Si and Mo sputtering particles were sputtered at an angle of incidence of 30° relative to the normal to the principal surface of the substrate 1. First, a Si film with a thickness of 4.2 nm was formed, and then, a Mo film with a thickness of 2.8 nm was formed, and these processes were defined as one cycle. In a similar manner, 40 cycles were repeated to accumulate layers. Then, a final Si film was formed so as to have a thickness of 4.0 nm and the multilayer reflective film 5 was completed. As a result, the lowermost layer of the multilayer reflective film 5, that is, the material of the multilayer reflective film 5 that contacts the conductive underlying film 4 was Si, and the uppermost layer of the multilayer reflective film 5, that is, the material of the multilayer reflective film 5 that contacts the protective film 6 was also Si. Moreover, a TaSi diffusion layer of 0.5 nm in thickness was formed between the conductive underlying film 4 and the lowermost Si layer of the multilayer reflective film 5. Here, the case of 40 cycles was used, but the number of cycles is not limited to 40, and the number may be 60, for example. The case of 60 cycles requires more steps than the case of 40 cycles, but it is possible to increase the reflectance to EUV light.

Protective Film

Next, the Ru protective film 6 having a thickness of 2.5 nm was formed by performing an ion beam sputtering process using a Ru target in an Ar gas atmosphere. Here, the Ru sputtering particles were sputtered at an angle of incidence of 30° relative to the normal to the principal surface of the substrate 1. Next, an annealing process was conducted at 130° C. in air. Next, by using this multilayer reflective film-equipped substrate on which the protective film 6 was formed, the reflectance of the substrate to EUV light, the flatness of the substrate on the side on which the multilayer reflective film 5 and the protective film 6 were formed, and the number of defects were measured. In addition, the surface roughness (surface smoothness) of a sample produced using the same method up through this step was also measured. The reflectance was 64%, the substrate flatness was 500 nm, the number of defects was five, and the RMS surface roughness was 0.14 nm. Here, the number of defects was measured using a defect inspection device (Mask Substrates/Blanks Defect Inspection System M1350 manufactured by Lasertec Corporation) in a 132 mm×132 mm region of the substrate 1 not including the peripheral region. Moreover, the surface roughness was measured using an atomic force microscope (AFM) in a 1 μm×1 μm region in the center of the substrate. In addition, when the multilayer reflective film-equipped substrate was inspected for defects using a high-sensitivity defect inspection device (Teron6xx manufactured by KLA-Tencor) that can detect defects with a size of 20 nm in spherical equivalent volume diameter (SEVD), few pseudo-defects were detected and the surface was of high enough quality to enable proper defect inspection.

Absorber Film

Next, by using a DC sputtering process, a TaBN film of 56 nm in film thickness was formed as the lower absorber film 71 and a TaBO film of 14 nm in film thickness was accumulated as the upper absorber film 72 in order to form the absorber film 7 that is constituted by this two-layer film. The TaBN film was formed by a reactive sputtering process using a TaB target in a mixed gas atmosphere of Ar gas and $N_2$ gas. The TaBO film was formed by a reactive sputtering process using a TaB target in a mixed gas atmosphere of Ar gas and $O_2$ gas. The TaBO film exhibits little change over time, and the TaBO film having this film thickness works as a function of an anti-reflective layer when the mask pattern is inspected with light, thereby increasing the inspection sensitivity. In many cases, when the mask pattern is inspected using an EB, the mask pattern is also inspected with light in order to improve throughput. In other words, a mask pattern inspection using an EB which has high inspection sensitivity is performed on regions in which smaller patterns such as memory cells are formed, while a mask pattern inspection using high-throughput light is performed on regions in which larger patterns such as indirect peripheral circuits are formed.

Reflective Mask

Next, the reflective mask 200 was manufactured using the reflective mask blank 100 described above. First, as illustrated in FIG. 4(b), a resist film 8 was formed on the upper absorber film 72 of the reflective mask blank 100. Then, a desired pattern such as a circuit pattern was drawn (exposed) onto the resist film 8, which was then developed and rinsed to form a predetermined resist pattern 8a, as illustrated in FIG. 4(c). Next, by using the resist pattern 8a as a mask, the TaBO film (the upper absorber film 72) was dry-etched using $CF_4$ gas, and then, the TaBN film (the lower absorber film 71) was dry-etched using $Cl_2$ gas to form a first absorber pattern 7a, as illustrated in FIG. 4(d). The Ru protective film 6 exhibits extremely high dry etching resistance to $Cl_2$ gas, and therefore the Ru protective film 6 provides sufficient etching stopper functionality. Then, as illustrated in FIG. 4(e), the resist pattern 8a was removed using an ashing process and a resist stripping solution, for example.

Next, as illustrated in FIG. 4(f), a resist film 9 was formed on the reflective mask blank on which the first absorber pattern 7a was formed. Then, a light-shielding band pattern was drawn (exposed) onto the resist film 9, which was then developed and rinsed to form a predetermined light-shielding band resist pattern 9a, as illustrated in FIG. 4(g). Next, by using the light-shielding band resist pattern 9a as a mask, the TaBO film was dry-etched using $CF_4$ gas, the TaBN film was dry-etched using $Cl_2$ gas, and the protective film 6 and the multilayer reflective film 5 were dry-etched using a mixed gas of $Cl_2$ and $O_2$ in order to form a second pattern in which a light-shielding band 11 was formed, as illustrated in FIG. 4(h). As illustrated in FIG. 4(h), this second pattern includes: a second absorber pattern 7b constituted by a two-layer pattern including an upper absorber pattern 72b and a lower absorber pattern 71b; a protective film pattern 6b; and a multilayer reflective film pattern 5b. As described above, here the conductive underlying film 4 was a Ta thin film with a film thickness of 4 nm. This material of the conductive underlying film 4 exhibits an extremely strong etching stopper functionality against the mixed gas of $Cl_2$ and $O_2$, and only undergoes an extremely small decrease in film thickness, thereby maintaining sufficient conductivity.

Next, the light-shielding band resist pattern 9a was removed using an ashing process and a resist stripping solution, for example. Then, by wet-cleaning using a sulfuric acid peroxide mixture (SPM) and an alkaline aqueous solution, the reflective mask 200 was completed as illustrated in FIG. 4(i). Then, a mask pattern EB defect inspection was performed, and any mask defects were appropriately fixed as necessary.

FIG. 5 is a top view of the reflective mask 200 manufactured using the method described above. As illustrated in FIG. 5(a), a device region (circuit pattern region) 12 in which circuits and the like are formed is separated by the light-shielding band 11 from the outer peripheral region (peripheral region) 13 as an isolated pattern. However, the device region 12 and the outer peripheral region 13 are electrically connected to one another via the conductive underlying film 4 that is constituted by the Ta thin film of 4 nm in film thickness. Here, the ground is connected to the outer peripheral region 13 in order to prevent adhesion of foreign materials to the device region on the mask. However, the device region is grounded via the connection formed by the conductive underlying film 4, thereby making it possible to prevent charge-up during mask pattern EB defect inspections. This, in turn, makes it possible to detect pattern defects of as small as 20 nm in size in the mask. Although the configuration in which the portion etched down through the multilayer reflective film 5 was the light-shielding band 11 was described above, the present invention is not limited to just this configuration. As illustrated in FIG. 5(b) which is another top view of the reflective mask 200, even when another region (an isolated circuit pattern region) 12b that is isolated as a pattern by a trench 14 etched down through the multilayer reflective film 5 is formed in the device region 12, that region 12b can still be electrically connected to the outer peripheral region 13 and grounded.

In the reflective mask 200 of the present example, the light-shielding band 11 of a multilayer reflective film-etched type was formed. However, the circuit pattern formation region was electrically connected to the ground formed outside of the light-shielding band 11 through the conductive underlying film 4 constituted by the Ta thin film of 4 nm in film thickness at the low sheet resistance. Therefore, there were no charge-up-induced problems such as pattern drawing defects, the deterioration in the sensitivity of mask pattern EB defect inspections, or detection of pseudo-defects. This made it possible to detect pattern defects of as small as 20 nm in size in the mask. Moreover, due to the presence of the conductive underlying film 4 that had a smooth surface, the multilayer reflective film 5 was formed on top of an extremely smooth film, thereby resulting in having just five defects in the protective film-equipped multilayer reflective film 5 and making it possible to produce a reflective mask of high quality in terms of the low number of defects.

Manufacture of Semiconductor Device

The reflective mask produced in Example 1 was set in an EUV scanner, and then EUV light was exposed onto a wafer in which a film to be treated and a resist film were formed on a semiconductor substrate. Next, the exposed resist film was developed to form a resist pattern on the semiconductor substrate on which the film to be treated was formed. The reflective mask produced in Example 1 had few phase defects in the multilayer reflective film 5 and was a high-quality mask in terms of having the low number of defects detected in the high-sensitivity EB mask pattern defect inspection, and therefore, the resist pattern formed by being transferred to the wafer also had few defects. Moreover, the reflectance of the light-shielding band 11 to light of wavelengths from 130 nm to 400 nm was 19%, and the amount of reflected out-of-band light from the light-shielding band 11 was sufficiently small, thereby resulting in a high transfer precision as well.

Furthermore, by transferring the resist pattern to the films to be treated by etching, and adding various other processes such as processes for forming insulating films and conductive films, introducing dopants, and annealing, it became possible to manufacture semiconductor devices with the desired properties at a high yield rate.

Example 2

Example 2 is an example of a reflective mask blank in which the material used for the single-layer conductive underlying film 4 was changed from the Ta material used in Example 1 to TaN, the material used for the protective film 6 was changed from the Ru material used in Example 1 to RuTi, and the temperature of the annealing process conducted after the formation of the protective film 6 was changed from 130° C. used in Example 1 to 150° C. The rest of Example 2 was the same as Example 1, including the method of manufacturing the reflective mask and the method of manufacturing the semiconductor device.

In Example 2, a TaN material (Ta: 90 at. %, N: 10 at. %) with a film thickness of 5 nm was used for the conductive underlying film 4. This film was formed using a DC sputtering process using a Ta target in a mixed gas atmosphere of Ar gas and $N_2$ gas. When the sheet resistance of a sample in which the steps up through the formation of the conductive underlying film 4 were completed was measured, the sheet resistance of the conductive underlying film 4 was 550Ω/□. Therefore, the level of the sheet resistance required to prevent charge-up during mask pattern EB defect inspections was achieved. The RMS surface roughness was 0.13 nm. Here, the surface roughness was measured using an atomic force microscope (AFM) in a 1 μm×1 μm region in the center of the substrate.

In Example 2, the protective film 6 was made of RuTi with a film thickness of 2.5 nm. This film was formed immediately after the multilayer reflective film 5, in which 40 layers of Si films and Mo films were alternately layered together, was formed under the same vacuum conditions without air releasing in the middle of the process in order to prevent oxidation. Here, in a similar manner as Example 1, the lowermost layer of the multilayer reflective film 5, that is, the material of the multilayer reflective film 5 that contacts the conductive underlying film 4, was Si, and the uppermost layer of the multilayer reflective film 5, that is, the material of the multilayer reflective film that contacts the protective film 6, was also Si. A TaN and Si diffusion layer of 0.5 nm in thickness was formed between the conductive underlying film 4 and the lowermost Si layer of the multilayer reflective film 5. The protective film 6 was formed using an ion beam sputtering process using a RuTi target (Ru: 95 at. %, Ti: 5 at. %) in an Ar gas atmosphere. Here, the Ru and Ti sputtering particles were sputtered at an angle of incidence of 30° relative to the normal to the principal surface of the substrate 1. Next, the annealing process was conducted at 150° C. after the protective film 6 was formed on the multilayer reflective film 5.

Next, by using this multilayer reflective film-equipped substrate on which the protective film 6 was formed, the reflectance of the substrate to EUV light and the flatness of the substrate were measured, and the number of defects was measured using a Mask Substrates/Blanks Defect Inspection System (M1350) manufactured by Lasertec Corporation. In addition, the surface roughness of a sample produced using the same method up through this step was also measured. The resulting reflectance was 65%, the substrate flatness was 350 nm, the number of defects was five, and the RMS surface roughness was 0.13 nm. Here, the number of defects and the surface roughness were measured using the same methods as in Example 1. By using RuTi (Ru: 95 at. %, Ti: 5 at. %) for the protective film 6, it became possible to prevent the diffusion of Si from the multilayer reflective film 5 into the protective film even though the annealing process was conducted at 150° C., which is a relatively high temperature. This made it possible to achieve the reflectance of 65% to EUV light, and also made it possible to achieve a preferable substrate flatness of 350 nm because the substrate stress was adjusted by the annealing process at 150° C. Moreover, when the multilayer reflective film-equipped substrate was inspected for defects using a high-sensitivity defect inspection device (Teron6xx manufactured by KLA-Tencor) that can detect defects of as small as 20 nm in SEVD size, few pseudo-defects were detected, and the surface was of high enough quality to enable proper defect inspection.

In a similar manner as Example 1, when the reflective mask was manufactured using the method according to Example 2, there were no charge-up-induced problems such as pattern drawing defects, the deterioration of sensitivity in the mask pattern EB defect inspection, or detection of pseudo-defects. This made it possible to detect pattern defects of as small as 20 nm in size in the mask. Moreover, due to the presence of the conductive underlying film 4 that had a smooth surface, the multilayer reflective film 5 was formed on top of an extremely smooth film, thereby resulting in having just five defects in the protective film-equipped multilayer reflective film and making it possible to produce a reflective mask of high quality in terms of having the low number of defects.

Furthermore, the reflective mask produced in Example 2 had few phase defects in the multilayer reflective film 5, and few defects were detected in the mask during the high-sensitivity mask pattern EB defect inspection. Therefore, the resist pattern that was transferred to the wafer also had few defects. Moreover, the reflectance of the light-shielding band 11 to light of wavelengths from 130 nm to 400 nm was 25%, and the amount of reflected out-of-band light from the light-shielding band 11 was sufficiently small, thereby resulting in a high transfer precision as well. This made it possible to manufacture semiconductor devices with the desired properties at a high yield rate.

Example 3

In Example 3, a reflective mask blank, a reflective mask, and a semiconductor device were manufactured by using the same configurations and the same methods as in Example 2, except that the order of filming of Si and Mo in the multilayer reflective film 5 was changed so that a Mo film is layered first.

Accordingly, in a similar manner as Example 2, in Example 3, the multilayer reflective film 5 was formed on the conductive underlying film 4. Here, the multilayer reflective film 5 was a Mo/Si cycle multilayer reflective film including a plurality of Mo and Si layers. By performing an ion beam sputtering process using a Mo target and a Si target in an Ar gas atmosphere, the multilayer reflective film 5 was formed by alternately layering a Mo layer and a Si layer onto the conductive underlying film 4. Here, the Mo and Si sputtering particles were sputtered at an angle of incidence of 30° relative to the normal to the principal surface of the substrate 1. First, a Mo film with a thickness of 2.8 nm was formed, and then, a Si film with a thickness of 4.2 nm was formed, and these processes were defined as one cycle. In a similar manner, 40 cycles were repeated to accumulate layers and the multilayer reflective film 5 was completed. As a result, the lowermost layer of the multilayer reflective film 5, that is, the material of the multilayer reflective film 5 that contacts the conductive underlying film 4, was Mo, and the uppermost layer of the multilayer reflective film 5, that is, the material of the multilayer reflective film 5 that contacts the protective film 6, was Si. Since the material of the multilayer reflective film 5 that contacts the conductive underlying film 4 is the Mo material, a diffusion layer is not easily formed at the interface between the conductive underlying film 4 and the multilayer reflective film 5, and therefore, changes in conductivity were small and stable.

Next, the protective film 6 was formed using the same material and method as in Example 2. Then, by using this multilayer reflective film-equipped substrate on which the protective film 6 was formed, the reflectance of the substrate to EUV light and the flatness of the substrate were measured. Also, the number of defects was measured using a Mask Substrates/Blanks Defect Inspection System (M1350) manufactured by Lasertec Corporation. In addition, the surface roughness of a sample produced using the same method up through this step was also measured. Similar to in Example 2, the temperature of the annealing process conducted after the formation of the protective film 6 was 150° C. Here, substantially the same results as in Example 2 were obtained: the reflectance was 65%, the substrate flatness was 350 nm, the number of defects was five, and the RMS surface roughness was 0.13 nm. The number of defects and the surface roughness were measured using the same methods as in Examples 1 and 2. Moreover, when the multilayer reflective film-equipped substrate was inspected for defects using a high-sensitivity defect inspection device (Teron6xx manufactured by KLA-Tencor) that can detect defects of as small as 20 nm in SEVD size, few pseudo-defects were detected, and the surface was of high enough quality to enable proper defect inspection.

Similar to in Example 2, when the reflective mask was manufactured using the method according to Example 3, there were no charge-up-induced problems such as pattern drawing defects, the deterioration of sensitivity in mask pattern EB defect inspection, or detection of pseudo-defects. This made it possible to detect pattern defects of as small as 20 nm in size in the mask. Moreover, due to the presence of the conductive underlying film 4 that had a smooth surface, the multilayer reflective film 5 was formed on top of an extremely smooth film, thereby resulting in having just five defects in the protective film-equipped multilayer reflective film and making it possible to produce a reflective mask of high quality in terms of the low number of defects.

Furthermore, the reflective mask produced in Example 3 had few phase defects in the multilayer reflective film 5, and few defects were detected in the mask during the high-sensitivity mask pattern EB defect inspection. Therefore, the resist pattern that was transferred to the wafer also had few defects. Moreover, the reflectance of the light-shielding band 11 to light of wavelengths from 130 nm to 400 nm was 26%, and the amount of reflected out-of-band light from the light-shielding band 11 was sufficiently small, thereby resulting in a high transfer precision as well. This made it possible to manufacture semiconductor devices with the desired properties at a high yield rate.

Example 4

In Example 4, a reflective mask blank, a reflective mask, and a semiconductor device were manufactured by using the same configurations and the same methods as in Example 2, except that the single-layer conductive underlying film 4 was replaced with a laminated conductive underlying film 3. Here, the laminated conductive underlying film 3 of Example 4 was a two-layer film including an uppermost layer 32 made of a TaN material of 2 nm in film thickness and a lower layer conductive film 31 made of a Ru material of 2 nm in film thickness.

The laminated conductive underlying film 3 was produced as described below. First, an ion beam sputtering process was performed on the principal surface (the first principal surface) of the substrate 1, using a Ru target in an Ar gas atmosphere to form a Ru film of 2 nm in film thickness as the conductive film 31. Here, the Ru sputtering particles were sputtered at an angle of incidence of 30° relative to the normal to the principal surface of the substrate 1. Then, a DC sputtering process was performed on the conductive film 31, using an Ta target in a mixed gas atmosphere of Ar gas and $N_2$ gas to form a TaN film (Ta: 90 at. %, N: 10 at. %) of 2 nm in film thickness as the uppermost layer 32. When the sheet resistance of a sample produced using the same method up through the formation of the laminated conductive underlying film 3 including the lower layer conductive film 31 and the uppermost layer 32 was measured, the sheet resistance of the laminated conductive underlying film 3 was 850Ω/□, which was a sufficiently small sheet resistance to prevent charge-up during mask pattern EB defect inspections. Moreover, the RMS surface roughness was 0.13 nm. Here, the surface roughness was measured using an atomic force microscope (AFM) in a 1 μm×1 μm region in the center of the substrate.

Next, the multilayer reflective film 5 and the protective film 6 were formed using the same materials and methods as in Example 2. Then, by using this multilayer reflective film-equipped substrate on which the protective film 6 was formed, the reflectance of the substrate to EUV light and the flatness of the substrate were measured. Also, the number of defects was measured using a Mask Substrates/Blanks Defect Inspection System (M1350) manufactured by Lasertec Corporation. In addition, the surface roughness of a sample produced using the same method up through this step was also measured. Similar to in Example 2, the temperature of the annealing process conducted after the formation of the protective film 6 was 150° C. The resulting reflectance was 65%, the substrate flatness was 350 nm, and the number of defects was five. The RMS surface roughness was 0.14 nm, which was substantially the same result as in Example 2. Here, the number of defects and the surface roughness were measured using the same methods as in Example 1. Moreover, when the multilayer reflective film-equipped substrate was inspected for defects using a high-sensitivity defect inspection device (Teron6xx manufactured by KLA-Tencor) that can detect defects of as small as 20 nm in SEVD size, few pseudo-defects were detected, and the surface was of high enough quality to enable proper defect inspection.

Similar to in Example 1, when the reflective mask was manufactured using the method according to Example 4, there were no charge-up-induced problems such as pattern drawing defects, the deterioration of the sensitivity in mask pattern EB defect inspection, or detection of pseudo-defects. This made it possible to detect pattern defects of as small as 20 nm in size in the mask. Moreover, due to the presence of the laminated conductive underlying film 3 that had a smooth surface, the multilayer reflective film 5 was formed on top of an extremely smooth film, thereby resulting in having just five defects in the protective film-equipped multilayer reflective film 5 and making it possible to produce a reflective mask of high quality in terms of the low number of defects.

Furthermore, the reflective mask produced in Example 4 had few phase defects in the multilayer reflective film 5, and few defects were detected in the mask during the high-sensitivity mask pattern EB defect inspection. Therefore, the resist pattern that was transferred to the wafer also had few defects. Moreover, the reflectance of the light-shielding band 11 to light of wavelengths from 130 nm to 400 nm was 22%, and the amount of reflected out-of-band light from the light-shielding band 11 was sufficiently small, thereby resulting in a high transfer precision as well. This made it possible to manufacture semiconductor devices with the desired properties at a high yield rate.

Example 5

In Example 5, a reflective mask blank, a reflective mask, and a semiconductor device were manufactured by using the same configurations and the same methods as in Example 2, except that the film thickness of the single-layer conductive underlying film 4 was changed from 5 nm used in Example 2 to 10 nm.

In Example 5, a TaN material (Ta: 90 at. %, N: 10 at. %) with a film thickness of 10 nm was used for the conductive underlying film 4. When the sheet resistance was measured in the same manner as in Example 2, the sheet resistance of the conductive underlying film 4 was 240Ω/□. Therefore, the sheet resistance required to prevent charge-up during mask pattern EB defect inspections was achieved. Moreover, the RMS surface roughness was 0.14 nm when measured in the same manner as in Example 2.

Next, by using the multilayer reflective film-equipped substrate on which the protective film 6 was formed, the reflectance to EUV light, the number of defects, and the surface roughness were measured using the same methods as in Example 1. Here, the reflectance was 65%, the number of defects was six, and the RMS surface roughness was 0.15 nm. Moreover, when the multilayer reflective film-equipped substrate was inspected for defects using a high-sensitivity defect inspection device (Teron6xx manufactured by KLA-Tencor) that can detect defects of as small as 20 nm in SEVD size, few pseudo-defects were detected, and the surface was of high enough quality to enable proper defect inspection. Similar to in Example 1, when the reflective mask was manufactured using the method according to Example 5, there were no charge-up-induced problems such as pattern drawing defects, the deterioration of sensitivity in the mask pattern EB defect inspection, or detection of pseudo-defects. This made it possible to detect pattern defects of as small as 20 nm in size in the mask. Moreover, due to the presence of the conductive underlying film 4 that had a smooth surface, the multilayer reflective film 5 was formed on top of an extremely smooth film, thereby resulting in having just six defects in the protective film-equipped multilayer reflective film 5 and making it possible to produce a reflective mask of high quality in terms of the low number of defects. Furthermore, the reflective mask produced in Example 5 had few phase defects in the multilayer reflective film 5, and few defects were detected in the mask during the high-sensitivity mask pattern EB defect inspection. Therefore, the resist pattern that was transferred to the wafer also had few defects. Moreover, the reflectance of the light-shielding band 11 to light of wavelengths from 130 nm to 400 nm was 39%, thereby making it possible to achieve a small reduction in the amount of reflected out-of-band light from the light-shielding band 11.

Example 6

In Example 6, a reflective mask blank, a reflective mask, and a semiconductor device were manufactured by using the same configurations and the same methods as in Example 4, except that the material used for the uppermost layer 32 of the laminated conductive underlying film 3 was changed from the TaN material used in Example 4 to a TaO material and that the film thickness of that layer was changed as well. In Example 6, a TaO material (Ta: 42 at. %, O: 58 at. %) was used for the uppermost layer 32, and samples with film thickness values of 1 nm, 4 nm, 6 nm, 8 nm, and 10 nm were produced. These films were formed by a DC sputtering process using a Ta target in a mixed gas atmosphere of Ar gas and $O_2$ gas. When the sheet resistance was measured in the same manner as in Example 2, the sheet resistance of the laminated conductive underlying film 3 in all of the samples was less than or equal to 2000Ω/□, thereby achieving the level of the sheet resistance required to prevent charge-up during mask pattern EB defect inspections. Moreover, the RMS surface roughness of the samples was less than or equal to 0.15 nm when measured in the same manner as in Example 2.

Next, by using the multilayer reflective film-equipped substrates on which the protective film 6 was formed, the reflectance to EUV light, the number of defects, and the surface roughness were measured using the same methods as in Example 1. Here, the reflectance was greater than or equal to 65%, the number of defects was less than or equal to six, and the RMS surface roughness was less than or equal to 0.16 nm. Moreover, when the multilayer reflective film-equipped substrate was inspected for defects using a high-sensitivity defect inspection device (Teron6xx manufactured by KLA-Tencor) that can detect defects of as small as 20 nm in SEVD size, few pseudo-defects were detected, and the surface was of high enough quality to enable proper defect inspection. Similar to in Example 1, when the reflective mask was manufactured using the method according to Example 6, there were no charge-up-induced problems such as pattern drawing defects, the deterioration of sensitivity in the mask pattern EB defect inspection, or detection of pseudo-defects. This made it possible to detect pattern defects of as small as 20 nm in size in the mask. Moreover, due to the presence of the laminated conductive underlying film 3 that had a smooth surface, the multilayer reflective film 5 was formed on top of an extremely smooth film, thereby resulting in having no more than six defects in the protective film-equipped multilayer reflective film 5 and making it possible to produce a reflective mask of high quality in terms of the low number of defects. In addition, the reflective mask produced in Example 6 had few phase defects in the multilayer reflective film 5, and few defects were detected in the mask during the high-sensitivity mask pattern EB defect inspection. Therefore, the resist pattern that was transferred to the wafer also had few defects.

Moreover, the amount of reflected out-of-band light was evaluated in terms of the maximum reflectance to light of wavelengths from 190 nm to 280 nm that does not pass through the substrate 1 as well as the maximum reflectance to light of wavelengths from 281 nm to 320 nm that pass through the substrate 1. Here, the reflectance of the light-shielding band 11 to light of wavelengths from 190 nm to 280 nm in the samples in which the film thickness values of the uppermost layer 32 were 1 nm, 4 nm, 6 nm, 8 nm, and 10 nm was 13%, 19%, 22%, 25%, and 28%, respectively, and the reflectance of the light-shielding band 11 to light of wavelengths from 281 nm to 320 nm was 26%, 24%, 23%, 23%, and 22%, respectively. Thus, the amount of reflected out-of-band light from the light-shielding band 11 was sufficiently small, thereby resulting in a high transfer precision. This made it possible to manufacture semiconductor devices with the desired properties at a high yield rate.

Example 7

In Example 7, a reflective mask blank, a reflective mask, and a semiconductor device were manufactured by using the same configurations and the same methods as in Example 4, except that the material used for the uppermost layer 32 of the laminated conductive underlying film 3 was changed from the TaN material used in Example 4 to a TaON material and that the film thickness of that layer was changed as well. In Example 7, a TaON material (Ta: 38 at. %, O: 52 at. %, N: 10 at. %) was used for the uppermost layer 32, and samples with film thickness values of 1 nm, 4 nm, 6 nm, 8 nm, and 10 nm were produced. These films were formed by a DC sputtering process using a Ta target in a mixed gas atmosphere of Ar gas, $O_2$ gas, and $N_2$ gas. When the sheet resistance was measured in the same manner as in Example 2, the sheet resistance of the laminated conductive underlying film 3 in all of the samples was less than or equal to 2000Ω/□, thereby achieving the level of the sheet resistance required to prevent charge-up during mask pattern EB defect inspections. Moreover, the RMS surface roughness of the samples was less than or equal to 0.15 nm when measured in the same manner as in Example 2.

Next, by using the multilayer reflective film-equipped substrates on which the protective film 6 was formed, the reflectance to EUV light, the number of defects, and the surface roughness were measured using the same methods as in Example 1. Here, the reflectance was greater than or equal to 65%, the number of defects was less than or equal to six, and the RMS surface roughness was less than or equal to 0.16 nm. Moreover, when the multilayer reflective film-equipped substrate was inspected for defects using a high-sensitivity defect inspection device (Teron6xx manufactured by KLA-Tencor) that can detect defects of as small as 20 nm in SEVD size, few pseudo-defects were detected, and the surface was of high enough quality to enable proper defect inspection. Similar to in Example 1, when the reflective mask was manufactured using the method according to Example 7, there were no charge-up-induced problems such as pattern drawing defects, the deterioration of sensitivity in the mask pattern EB defect inspection, or detection of pseudo-defects. This made it possible to detect pattern defects of as small as 20 nm in size in the mask. Moreover, due to the presence of the laminated conductive underlying film 3 that had a smooth surface, the multilayer reflective film 5 was formed on top of an extremely smooth film, thereby resulting in no more than six defects in the protective film-equipped multilayer reflective film 5 and making it possible to produce a reflective mask of high quality in terms of having the low number of defects. In addition, the reflective mask produced in Example 7 had few phase defects in the multilayer reflective film 5, and few defects were detected in the mask during the high-sensitivity mask pattern EB defect inspection. Therefore, the resist pattern that was transferred to the wafer also had few defects.

Furthermore, when the amount of reflected out-of-band light was evaluated using the same procedure as in Example 6, the reflectance of the light-shielding band 11 to light of wavelengths from 190 nm to 280 nm in the samples in which the film thickness values of the uppermost layer 32 were 1 nm, 4 nm, 6 nm, 8 nm, and 10 nm was 14%, 19%, 23%, 26%, and 28%, respectively, and the reflectance of the light-shielding band 11 to light of wavelengths from 281 nm to 320 nm was 26%, 24%, 25%, 26%, and 27%, respectively. Thus, the amount of reflected out-of-band light from the light-shielding band 11 was sufficiently small, thereby resulting in a high transfer precision. This made it possible to manufacture semiconductor devices with the desired properties at a high yield rate.

Example 8

Example 8 was a reflective mask blank in which a Ru film with a film thickness of 3 nm was used for the single-layer conductive underlying film 4. Other than the conductive underlying film 4, the configuration of the reflective mask blank was the same as in Example 1. To form the conductive underlying film 4 in Example 8, an ion beam sputtering process was performed using a Ru target in an Ar gas atmosphere to form a Ru film with a film thickness of 3 nm on the principal surface (on the first principal surface) of the substrate 1 which is opposite to the side on which the rear surface conductive film 2 was formed. Here, the Ru sputtering particles were sputtered at an angle of incidence of 30° relative to the normal to the principal surface of the substrate 1. When the sheet resistance of a sample produced using the same method up through the formation of the conductive underlying film 4 was measured, the sheet resistance of the conductive underlying film 4 was 500Ω/□, which was a sufficiently low sheet resistance to prevent charge-up during the mask pattern EB defect inspections.

Next, by using this multilayer reflective film-equipped substrate on which the protective film 6 (an Ru film of 2.5 nm in thickness) was formed, the reflectance of the substrate to EUV light, the flatness of the substrate on the side on which the multilayer reflective film 5 and the protective film 6 were formed, and the number of defects were measured. In addition, the surface roughness (surface smoothness) of a sample produced using the same method up through this step was also measured. The resulting reflectance was 64%, the substrate flatness was 500 nm, the number of defects was five, and the RMS surface roughness was 0.14 nm. Here, the number of defects was measured by using a defect inspection device (Mask Substrates/Blanks Defect Inspection System M1350 manufactured by Lasertec Corporation) in a 132 mm×132 mm region of the substrate 1 not including the peripheral region. Moreover, the surface roughness was measured by using an atomic force microscope (AFM) in a 1 μm×1 μm region in the center of the substrate. In addition, when the multilayer reflective film-equipped substrate was inspected for defects using a high-sensitivity defect inspection device (Teron6xx manufactured by KLA-Tencor) that can detect defects of as small as 20 nm in spherical equivalent volume diameter (SEVD) size, few pseudo-defects were detected, and the surface was of high enough quality to enable proper defect inspection.

The method of manufacturing the reflective mask using the reflective mask blank of Example 8 was the same as in Example 1, however, the process for forming the light-shielding band 11 (illustrated in FIGS. 4(f) through 4(g)) using the light-shielding band resist pattern 9a as a mask was as follows. The TaBO film was dry-etched using $CF_4$ gas, the TaBN film was dry-etched using $Cl_2$ gas, the protective film 6 was dry-etched using a mixed gas of $O_2$ and $Cl_2$ or a mixed gas of $O_2$ and Br-based, and the multilayer reflective film 5 was dry-etched using $Cl_2$ gas in order to form a second pattern in which the light-shielding band 11 was formed (FIG. 4(h)). As illustrated in FIG. 4(h), this second pattern includes: a second absorber pattern 7b constituted by a two-layer pattern including an upper absorber pattern 72b and a lower absorber pattern 71b; a protective film pattern 6b; and a multilayer reflective film pattern 5b. As described above, here the conductive underlying film 4 was a Ru thin film with a film thickness of 3 nm. This material exhibits an extremely strong etching stopper functionality against $Cl_2$ gas and only undergoes an extremely small decrease in film thickness, thereby maintaining sufficient conductivity. Next, the light-shielding band resist pattern 9a was removed using an ashing process and a resist stripping solution, for example, and the wet-cleaning process using a sulfuric acid peroxide mixture (SPM) and an alkaline aqueous solution was conducted. The rest of the method of manufacturing the reflective mask as well as the method of manufacturing the semiconductor device and the like were the same as in Example 1.

Similar to in Example 1, when the reflective mask was manufactured using the method according to Example 8, there were no charge-up-induced problems such as pattern drawing defects, the deterioration of sensitivity in the mask pattern EB defect inspection, or detection of pseudo-defects. This made it possible to detect pattern defects of as small as 20 nm in size in the mask. Moreover, due to the presence of the conductive underlying film 4 that had a smooth surface, the multilayer reflective film 5 was formed on top of an extremely smooth film, thereby resulting in having just five defects in the protective film-equipped multilayer reflective film and making it possible to produce a reflective mask of high quality in terms of having the low number of defects.

Example 9

Example 9 is an example of a reflective mask blank in which the material used for the conductive underlying film 4 and the protective film 6 was changed from the Ru material used in Example 8 to RuTi, and the temperature of the annealing process after the formation of the protective film 6 was changed from the temperature of 130° C. used in Example 1 to 150° C. The rest of Example 9 was the same as Example 8, including the method of manufacturing the reflective mask and the method of manufacturing the semiconductor device.

In Example 9, a RuTi material with a film thickness of 2 nm was used for the conductive underlying film 4. This film was formed by an ion beam sputtering process using a RuTi target (Ru: 95 at. %, Ti: 5 at. %) in an Ar gas atmosphere. Here, the Ru and Ti sputtering particles were sputtered at an angle of incidence of 30° relative to the normal to the principal surface of the substrate 1. When the sheet resistance of a sample in which the same steps up through the formation of the conductive underlying film 4 were completed was measured, the sheet resistance of the conductive underlying film 4 was 1200Ω/□, thereby achieving the level of the sheet resistance required to prevent charge-up during the mask pattern EB defect inspections.

In Example 9, the protective film 6 was made of RuTi with a film thickness of 2.5 nm. This film was formed immediately after the formation of the RuTi conductive underlying film 4 and the multilayer reflective film 5 (in which 40 layers of Mo films and Si films were alternately layered together) under the same vacuum conditions without air releasing in order to prevent oxidation. This film was formed by an ion beam sputtering process using a RuTi target (Ru: 95 at. %, Ti: 5 at. %) in an Ar gas atmosphere. Here, the Ru and Ti sputtering particles were sputtered at an angle of incidence of 30° relative to the normal to the principal surface of the substrate 1. Next, the annealing process at 150° C. was conducted after the protective film 6 was formed on the multilayer reflective film 5.

Next, by using this multilayer reflective film-equipped substrate on which the protective film 6 was formed, the reflectance of the substrate to EUV light and the flatness of the substrate were measured. Also, the number of defects was measured using a Mask Substrates/Blanks Defect Inspection System (M1350) manufactured by Lasertec Corporation. In addition, the surface roughness of a sample produced using the same method up through this step was also measured. The resulting reflectance was 65%, the substrate flatness was 350 nm, the number of defects was four, and the RMS surface roughness was 0.14 nm. Here, the number of defects and the surface roughness were measured using the same methods as in Example 1. By using RuTi (Ru: 95 at. %, Ti: 5 at. %) for the protective film 6, it became possible to prevent the diffusion of Si from the multilayer reflective film 5 into the protective film even though the annealing process was conducted at 150° C., which is a relatively high temperature. This made it possible to achieve the reflectance of 65% to EUV light. Also, it became possible to achieve a preferable substrate flatness of 350 nm because the substrate stress was adjusted by the annealing process at 150° C. Moreover, when the multilayer reflective film-equipped substrate was inspected for defects using a high-sensitivity defect inspection device (Teron6xx manufactured by KLA-Tencor) that can detect defects of as small as 20 nm in SEVD size, few pseudo-defects were detected, and the surface was of high enough quality to enable proper defect inspection.

Similar to in Example 1, when the reflective mask was manufactured using the method according to Example 9, there were no charge-up-induced problems such as pattern drawing defects, the deterioration in sensitivity in the mask pattern EB defect inspection, or detection of pseudo-defects. This made it possible to detect pattern defects of as small as 20 nm in size in the mask. Moreover, due to the presence of the conductive underlying film 4 that had a smooth surface, the multilayer reflective film 5 was formed on top of an extremely smooth film, thereby resulting in just four defects in the protective film-equipped multilayer reflective film 5 and making it possible to produce a reflective mask of high quality in terms of the low number of defects.

Furthermore, the reflective mask produced in Example 9 had few phase defects in the multilayer reflective film 5, and few defects were detected in the mask during the high-sensitivity mask pattern EB defect inspection. Therefore, the resist pattern that was transferred to the wafer also had few defects. This made it possible to manufacture semiconductor devices with the desired properties at a high yield rate.

Example 10

In Example 10, a reflective mask blank, a reflective mask, and a semiconductor device were manufactured by using the same configurations and the same methods as in Example 8, except that a buffer film 10 made of Si was formed between the substrate 1 and the conductive underlying film 4 and that the film thickness of the Ru conductive underlying film 4 was changed to 2 nm.

Example 10 was a mask blank in which the buffer film 10 was formed on the first principal surface of the substrate 1. The buffer film 10 having a film thickness of 30 nm was formed by an ion beam sputtering process using a Si target in an Ar gas atmosphere. Here, the Si sputtering particles were sputtered at an angle of incidence of 30° relative to the normal to the principal surface of the substrate 1. Next, the Ru conductive underlying film 4 was formed on the buffer film 10 using the same method as in Example 8. The other difference between the present example and Example 8 was only the film thickness of the conductive underlying film 4. The film thickness of the conductive underlying film 4 was 3 nm in Example 8, but it was changed to 2 nm in Example 10. Accordingly, the conductive underlying film 4 was formed by an ion beam sputtering process using a Ru target in an Ar gas atmosphere, and the Ru sputtering particles were sputtered at an angle of incidence of 30° relative to the normal to the principal surface of the substrate 1. When the sheet resistance of a sample in which the same steps up through the formation of the conductive underlying film 4 were completed was measured, the sheet resistance of the multilayer film including the buffer film 10 and the conductive underlying film 4 was 800Ω/□, thereby achieving the level of sheet resistance required to prevent charge-up during the mask pattern EB defect inspections.

Next, the multilayer reflective film 5 and the protective film 6 were formed using the same materials and methods as in Example 1. Then, by using this multilayer reflective film-equipped substrate on which the protective film 6 was formed, the reflectance of the substrate to EUV light and the flatness of the substrate were measured. Also, the number of defects was measured using a Mask Substrates/Blanks Defect Inspection System (M1350) manufactured by Lasertec Corporation. In addition, the surface roughness of a sample produced using the same method up through this step was also measured. Similar to in Example 1, the temperature of the annealing process conducted after the formation of the protective film 6 was 130° C. Substantially the same results as in Example 8 were obtained: the reflectance was 64%, the substrate flatness was 500 nm, the number of defects was six, and the RMS surface roughness was 0.14 nm. Here, the number of defects and the surface roughness were measured using the same methods as in Example 1. Moreover, when the multilayer reflective film-equipped substrate was inspected for defects using a high-sensitivity defect inspection device (Teron6xx manufactured by KLA-Tencor) that can detect defects of as small as 20 nm in SEVD size, few pseudo-defects were detected, and the surface was of high enough quality to enable proper defect inspection.

Similar to in Example 1, when the reflective mask was manufactured using the method according to Example 10, there were no charge-up-induced problems such as pattern drawing defects, deterioration in the sensitivity in the mask pattern EB defect inspection, or detection of pseudo-defects. This made it possible to detect pattern defects of as small as 20 nm in size in the mask. Moreover, due to the presence of the conductive underlying film 4 that had a smooth surface, the multilayer reflective film 5 was formed on top of an extremely smooth film, thereby resulting in having just six defects in the protective film-equipped multilayer reflective film 5 and making it possible to produce a reflective mask of high quality in terms of having the low number of defects.

In addition, the reflective mask produced in Example 10 had few phase defects in the multilayer reflective film 5, and few defects were detected in the mask during the high-sensitivity mask pattern EB defect inspection. Therefore, the resist pattern that was transferred to the wafer also had few defects. This made it possible to manufacture semiconductor devices with the desired properties at a high yield rate.

Example 11

In Example 11, a reflective mask blank, a reflective mask, and a semiconductor device were manufactured by using the same configurations and the same methods as in Example 8, except that a buffer film 10 constituted by a multilayer film made of Si and Mo was formed between the substrate 1 and the conductive underlying film 4, and that the film thickness of the Ru conductive underlying film 4 was changed to 2 nm.

Example 11 was a mask blank in which the buffer film 10 constituted by a laminated film made of Si and Mo was formed on the first principal surface of the substrate 1. This buffer film 10 was formed by an ion beam sputtering process using a Si target and a Mo target in an Ar gas atmosphere to alternately layer a Si layer and a Mo layer onto the substrate 1. Here, the Si and Mo sputtering particles were sputtered at an angle of incidence of 30° relative to the normal to the principal surface of the substrate 1. First, a Si film with a thickness of 4 nm was formed, and then, a Mo film with a thickness of 3 nm was formed, and these processes were defined as one cycle. This cycle was then repeated 10 times. Next, by using the same method as in Example 8, the Ru conductive underlying film 4 was formed on the buffer film 10 constituted by the laminated film. The other difference between the present example and Example 8 was only the film thickness of the conductive underlying film 4. The film thickness of the conductive underlying film 4 was 3 nm in Example 8, but it was changed to 2 nm in Example 11. Accordingly, the conductive underlying film 4 was formed by an ion beam sputtering process using a Ru target in an Ar gas atmosphere, and the Ru sputtering particles were sputtered at an angle of incidence of 30° relative to the normal to the principal surface of the substrate 1. When the sheet resistance of a sample in which the same steps up through the formation of the conductive underlying film 4 were completed was measured, the sheet resistance of the multilayer film including the multilayer buffer film 10 and the conductive underlying film 4 was 100Ω/□, thereby achieving a sufficiently small sheet resistance to prevent charge-up during the mask pattern EB defect inspections.

Next, the multilayer reflective film 5 and the protective film 6 were formed using the same materials and methods as in Example 1. Then, by using this multilayer reflective film-equipped substrate on which the protective film 6 was formed, the reflectance of the substrate to EUV light and the flatness of the substrate were measured. Also, the number of defects was measured using a Mask Substrates/Blanks Defect Inspection System (M1350) manufactured by Lasertec Corporation. In addition, the surface roughness of a sample produced using the same method up through this step was also measured. Similar to in Example 1, the temperature of the annealing process conducted after the formation of the protective film 6 was 130° C. Substantially the same results as in Example 8 were obtained: the reflectance was 64%, the substrate flatness was 550 nm, the number of defects was seven, and the RMS surface roughness was 0.14 nm. Here, the number of defects and the surface roughness were measured using the same methods as in Example 1. Moreover, when the multilayer reflective film-equipped substrate was inspected for defects using a high-sensitivity defect inspection device (Teron6xx manufactured by KLA-Tencor) that can detect defects of as small as 20 nm in SEVD size, few pseudo-defects were detected, and the surface was of high enough quality to enable proper defect inspection.

Similar to in Example 1, when the reflective mask was manufactured using the method according to Example 11, there were no charge-up-induced problems such as pattern drawing defects, deterioration in the sensitivity in the mask pattern EB defect inspection, or detection of pseudo-defects. This made it possible to detect pattern defects of as small as 20 nm in size in the mask. Moreover, due to the presence of the conductive underlying film 4 that had a smooth surface, the multilayer reflective film 5 was formed on top of an extremely smooth film, thereby resulting in having just seven defects in the protective film-equipped multilayer reflective film 5 and making it possible to produce a reflective mask of high quality in terms of having the low number of defects.

In addition, the reflective mask produced in Example 11 had few phase defects in the multilayer reflective film 5, and few defects were detected in the mask during the high-sensitivity mask pattern EB defect inspection. Therefore, the resist pattern that was transferred to the wafer also had few defects. This made it possible to manufacture semiconductor devices with the desired properties at a high yield rate.

Comparison Example

In a comparison example, a reflective mask blank and a reflective mask were manufactured by using the same configurations and the same methods as in Example 1, except that a Ta film with a film thickness of 30 nm was used for the conductive underlying film 4. Moreover, a semiconductor device was manufactured by using exactly the same method as in Example 1.

In the comparison example, a Ta film with a film thickness of 30 nm was used for the conductive underlying film 4. This film was formed by a sputtering process using a Ta target in an Ar gas atmosphere. When the sheet resistance of a sample in which the same steps up through the formation of the conductive underlying film 4 were completed was measured, the sheet resistance of the conductive underlying film 4 was 70Ω/□. Therefore, the sheet resistance required to prevent charge-up during the mask pattern EB defect inspections was achieved.

Next, the multilayer reflective film 5 and the protective film 6 were formed using the same materials and methods as in Example 1. Then, by using this multilayer reflective film-equipped substrate on which the protective film 6 was formed, the reflectance of the substrate to EUV light and the flatness of the substrate were measured. Also, the number of defects was measured using a Mask Substrates/Blanks Defect Inspection System (M1350) manufactured by Lasertec Corporation. In addition, the surface roughness of a sample produced using the same method up through this step was also measured. Similar to in Example 1, the temperature of the annealing process conducted after the formation of the protective film 6 was 150° C. The resulting reflectance was 60%, and the substrate flatness was 800 nm. The number of defects was 10. However, when a defect inspection was performed using a high-sensitivity defect inspection device (Teron6xx manufactured by KLA-Tencor) that can detect defects of as small as 20 nm in SEVD size, the number of pseudo-defects detected was so large (more than 100,000) that no measurements could be taken. The RMS surface roughness was 0.60 nm, which was more than 4.6 times greater than the RMS surface roughness in Example 1. Here, the number of defects and the surface roughness were measured using the same methods as in Example 1.

Similar to in Example 1, when the reflective mask was manufactured using the method according to the comparison example, there were no EB charge-up-induced problems such as pattern drawing defects or deterioration in the sensitivity in the absorber pattern inspection. However, the surface of the protective film-equipped multilayer reflective film was very rough, and the inspection results of defects of the multilayer reflective film 5 were completely saturated with pseudo-defects, and therefore, it was not even possible to judge if there were phase defects or amplitude defects. Moreover, when a pattern transfer evaluation was conducted by using this reflective mask, a large number of transfer defects were observed. Therefore, the reflective mask manufactured using the method according to the comparison example was not able to guarantee any level of mask quality because of the number of defects. Also, the reflectance of the light-shielding band 11 to light of wavelengths from 130 nm to 400 nm was 40%, and a large amount of reflected out-of-band light from the light-shielding band 11 was observed, thereby resulting in poor pattern transfer precision. As a result, the yield rate was low when a semiconductor device was manufactured by using the reflective mask produced in the comparison example.

Furthermore, in Example 2 as described above, the temperature of the annealing process conducted after the formation of the protective film 6 was set to be further high temperatures (such as 180° C., 200° C., 250° C., and 300° C., with the annealing times being adjusted as appropriate) in manufacturing the reflective mask blank. As a result of that, it was found that the flatness of the substrate was further improved compared with Example 2, and an extremely flat reflective mask blank was obtained.

REFERENCE SIGNS LIST

1 Substrate
2 Conductive film
3 Laminated conductive underlying film
4 Conductive underlying film
5 Multilayer reflective film
5b Multilayer reflective film pattern
6 Protective film
6b Protective film pattern
7 Absorber film
7a First absorber pattern
7b Second absorber pattern
8 Resist film
8a Resist pattern
9 Resist film
9a Light-shielding band resist pattern
11 Light-shielding band
12 Circuit pattern region
12b Isolated circuit pattern region
13 Peripheral region
14 Trench
31 Conductive film
32 Uppermost layer
71 TaBN absorber film (lower absorber film)
71a TaBN film pattern (lower absorber pattern)
71b TaBN film pattern (lower absorber pattern)
72 TaBO film (upper absorber film)
72a TaBO film pattern (upper absorber pattern)
72b TaBO film pattern (upper absorber pattern)
100 Reflective mask blank (first EUV lithography reflective mask blank)
101 Reflective mask blank (second EUV lithography reflective mask blank)
102 Reflective mask blank (fourth EUV lithography reflective mask blank)
200 Reflective mask

The invention claimed is:

1. A reflective mask blank comprising:
a substrate;
a conductive underlying film layered on the substrate;
a multilayer reflective film for reflecting exposure light that is layered on the conductive underlying film; and
an absorber film for absorbing exposure light that is layered on the multilayer reflective film, wherein
the conductive underlying film is formed adjacent to the multilayer reflective film and comprises a tantalum-based material with a film thickness of greater than or equal to 1 nm and less than or equal to 10 nm, and
a reflectance of the conductive underlying film to light of wavelengths from 130 nm to 400 nm is 39% or less.

2. A reflective mask blank comprising:
a substrate;
a conductive underlying film layered on the substrate;
a multilayer reflective film for reflecting exposure light that is layered on the conductive underlying film; and
an absorber film for absorbing exposure light that is layered on the multilayer reflective film, wherein
the conductive underlying film is constituted by a laminated film including a layer of a tantalum-based material with a film thickness of greater than or equal to 1 nm and less than or equal to 10 nm that is formed adjacent to the multilayer reflective film, and a layer of a conductive material that is formed between the layer of the tantalum-based material and the substrate, and
the reflectance of the conductive underlying film to light of wavelengths from 130 nm to 400 nm is 39% or less.

3. The reflective mask blank according to claim 1, wherein the tantalum-based material contains at least one of nitrogen and oxygen.

4. The reflective mask blank according to claim 1, further comprising:
a protective film formed on the multilayer reflective film, wherein
the protective film is made of a ruthenium-based material.

5. The reflective mask blank according to claim 1, wherein
the multilayer reflective film is formed by alternately layering a first layer containing silicon and a second layer containing molybdenum, and
a lowermost layer of the multilayer reflective film that contacts the conductive underlying film is the first layer.

6. The reflective mask blank according to claim 1, wherein
the multilayer reflective film is formed by alternately layering a first layer containing silicon and a second layer containing molybdenum, and
a lowermost layer of the multilayer reflective film that contacts the conductive underlying film is the second layer.

7. The reflective mask produced by using the reflective mask blank according to claim 1.

8. A method of manufacturing a reflective mask, comprising:
preparing the reflective mask blank according to claim 1;
forming a resist pattern on the absorber film and then forming an absorber pattern by etching using the resist pattern as a mask, or forming a resist pattern after forming a hard mask film for etching on the absorber film and then forming an absorber pattern by etching using the hard mask to transfer the resist pattern to the absorber film; and dry etching a portion of the multilayer reflective film by using a chlorine-based gas that contains oxygen gas.

9. The method of manufacturing the reflective mask according to claim 8, wherein a location of the portion of the multilayer reflective film that is etched is a light-shielding band region formed so as to surround a circuit pattern region.

10. The method of manufacturing the reflective mask according to claim 8, wherein a protective film made of a ruthenium-based material is formed on the multilayer reflective film, and the protective film and the multilayer reflective film are dry-etched successively.

11. A method of manufacturing a semiconductor device using the reflective mask according to claim 7, comprising:
transferring a pattern formed on the reflective mask to a resist film formed on a semiconductor substrate by light exposure.

12. A reflective mask blank comprising:
a substrate;
a conductive underlying film layered on the substrate;
a multilayer reflective film for reflecting exposure light that is layered on the conductive underlying film; and
an absorber film for absorbing exposure light that is layered on the multilayer reflective film, wherein
the conductive underlying film is formed adjacent to the multilayer reflective film and comprises a ruthenium-based material with a film thickness of greater than or equal to 1 nm and less than or equal to 10 nm, and
the reflectance of the conductive underlying film to light of wavelengths from 130 nm to 400 nm is 39% or less.

13. The reflective mask blank according to claim 12, further comprising:
a buffer film formed between the conductive underlying film and the substrate in order to buffer negative effects caused by defects or roughness on a surface of the substrate against a surface of the multilayer reflective film.

14. The reflective mask blank according to claim 12, further comprising:
a protective film formed on the multilayer reflective film, wherein
the protective film is made of a ruthenium-based material.

15. The reflective mask blank according to claim 14, wherein the ruthenium-based material contains titanium.

16. A method of manufacturing a reflective mask blank, comprising the steps of:
forming a conductive underlying film on a substrate by using a sputtering process;
forming a multilayer reflective film that reflects exposure light adjacent to the conductive underlying film; and
forming an absorber film that absorbs exposure light, wherein
the conductive underlying film comprises a ruthenium-based material with a film thickness of greater than or equal to 1 nm and less than or equal to 10 nm, and
the reflectance of the conductive underlying film to light of wavelengths from 130 nm to 400 nm is 39% or less.

17. The method of manufacturing the reflective mask blank according to claim 16, wherein the conductive underlying film is formed by using an ion beam sputtering process.

18. The method of manufacturing the reflective mask blank according to claim 16, wherein the conductive underlying film is formed by sputtering particles of a material used for the conductive underlying film at an angle of incidence of less than or equal to 45° relative to a normal to a principal surface of the substrate.

19. The method of manufacturing the reflective mask blank according to claim 16, wherein the forming of the conductive underlying film and the forming of the multilayer reflective film are performed successively under the same vacuum conditions.

20. The method of manufacturing the reflective mask blank according to claim 16, further comprising the steps of:
forming a protective film on the multilayer reflective film after the forming of the multilayer reflective film, wherein
the protective film is made of a ruthenium-based material.

21. The method of manufacturing the reflective mask blank according to claim 20, wherein the ruthenium-based material contains titanium.

22. The method of manufacturing the reflective mask blank according to claim 20, wherein an annealing process is conducted at a temperature of higher than or equal to 100° C. and lower than or equal to 300° C. after the formation of the protective film on the multilayer reflective film.

23. A method of manufacturing a reflective mask, comprising:
preparing the reflective mask blank according to claim 12;
forming a resist pattern on the absorber film and then forming an absorber pattern by etching using the resist pattern as a mask, or
forming a resist pattern after forming a hard mask film for etching on the absorber film and then forming an absorber pattern by etching with using the hard mask to transfer the resist pattern to the absorber; and
etching a portion of the multilayer reflective film.

24. The method of manufacturing the reflective mask according to claim 23, wherein a location of the portion of the multilayer reflective film that is etched is a light-shielding band region formed so as to surround a circuit pattern region.

25. A method of manufacturing a semiconductor device using a reflective mask manufactured by the method according to claim 23, comprising:
transferring a pattern formed on the reflective mask to a resist film formed on a semiconductor substrate by light exposure.

26. The reflective mask blank according to claim 2, wherein the tantalum-based material contains at least one of nitrogen and oxygen.

27. The reflective mask blank according to claim 2, further comprising:
a protective film formed on the multilayer reflective film, wherein
the protective film is made of a ruthenium-based material.

28. The reflective mask blank according to claim 2, wherein
the multilayer reflective film is formed by alternately layering a first layer containing silicon and a second layer containing molybdenum, and
a lowermost layer of the multilayer reflective film that contacts the conductive underlying film is the first layer.

29. The reflective mask blank according to claim 2, wherein the multilayer reflective film is formed by alternately layering a first layer containing silicon and a second layer containing molybdenum, and a lowermost layer of the multilayer reflective film that contacts the conductive underlying film is the second layer.

30. A reflective mask produced by using the reflective mask blank according to claim 2.

31. A method of manufacturing a reflective mask, comprising:

preparing the reflective mask blank according to claim 2;

forming a resist pattern on the absorber film and then forming an absorber pattern by etching using the resist pattern as a mask, or forming a resist pattern after forming a hard mask film for etching on the absorber film and then forming an absorber pattern by etching using the hard mask to transfer the resist pattern to the absorber film; and dry etching a portion of the multilayer reflective film by using a chlorine-based gas that contains oxygen gas.

32. The method of manufacturing the reflective mask according to claim 31, wherein a location of the portion of the multilayer reflective film that is etched is a light-shielding band region formed so as to surround a circuit pattern region.

33. The method of manufacturing the reflective mask according to claim 31, wherein a protective film made of a ruthenium-based material is formed on the multilayer reflective film, and the protective film and the multilayer reflective film are dry-etched successively.

34. A method of manufacturing a semiconductor device using the reflective mask according to claim 30, comprising:

transferring a pattern formed on the reflective mask to a resist film formed on a semiconductor substrate by light exposure.

* * * * *